(12) United States Patent
Bang et al.

(10) Patent No.: US 10,803,958 B2
(45) Date of Patent: Oct. 13, 2020

(54) NON-VOLATILE MEMORY DEVICE AND A METHOD OF OPERATING THE SAME

(71) Applicant: SAMSUNG ELECTRONICS CO., LTD., Suwon-si, Gyeonggi-do (KR)

(72) Inventors: Jin-bae Bang, Anyang-si (KR); Dae-seok Byeon, Seongnam-si (KR); Ji-su Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/149,327

(22) Filed: Oct. 2, 2018

(65) Prior Publication Data

US 2019/0214094 A1 Jul. 11, 2019

(30) Foreign Application Priority Data

Jan. 10, 2018 (KR) .................. 10-2018-0003446

(51) Int. Cl.
  *G11C 16/26* (2006.01)
  *G11C 11/56* (2006.01)
  *G11C 16/04* (2006.01)
  *H01L 27/11582* (2017.01)

(52) U.S. Cl.
  CPC .......... *G11C 16/26* (2013.01); *G11C 11/5671* (2013.01); *G11C 16/0483* (2013.01); *H01L 27/11582* (2013.01)

(58) Field of Classification Search
  None
  See application file for complete search history.

(56) References Cited

U.S. PATENT DOCUMENTS

| | | | |
|---|---|---|---|
| 8,116,141 B2 | 2/2012 | Yoo et al. |
| 8,358,542 B2 | 1/2013 | Radke et al. |
| 8,873,285 B2 | 10/2014 | Sharon et al. |
| 9,036,412 B2 | 5/2015 | Choi et al. |
| 9,036,417 B2 | 5/2015 | Chen et al. |
| 9,117,536 B2 | 8/2015 | Yoon et al. |
| 9,164,881 B2 | 10/2015 | Seol et al. |
| 9,472,298 B1 | 10/2016 | Louie et al. |
| 9,570,190 B2 | 2/2017 | Cho |

(Continued)

FOREIGN PATENT DOCUMENTS

KR    10-2014-0050145    4/2014

*Primary Examiner* — Douglas King
(74) *Attorney, Agent, or Firm* — F. Chau & Associates, LLC

(57) ABSTRACT

A non-volatile memory device includes a memory cell array including a plurality of memory cells; a page buffer for performing a plurality of read operations and storing results of the read operations, wherein each of the read operations includes at least one sensing operation for selected memory cells from the plurality of memory cells; a multi-sensing manager for determining a number of sensing operations for each of the plurality of read operations and controlling the page buffer to perform the read operations; and a data identifier for identifying a data state of a bit for the selected memory cells based on the results of the read operations, wherein the multi-sensing manager determines the number of sensing operations for at least one read operation from among the read operations to be different from the number of sensing operations for other read operations from among the read operations.

19 Claims, 18 Drawing Sheets

(56) References Cited

U.S. PATENT DOCUMENTS

| | | |
|---|---|---|
| 9,766,973 B2 | 9/2017 | Choi et al. |
| 2009/0237992 A1* | 9/2009 | Maejima ............. G11C 11/5642 365/185.03 |
| 2012/0033498 A1* | 2/2012 | Kim .................... G11C 11/5642 365/185.18 |
| 2012/0155197 A1* | 6/2012 | Joo ....................... G11C 16/26 365/189.15 |
| 2014/0022853 A1 | 1/2014 | Choi et al. |
| 2016/0132256 A1 | 5/2016 | Jung |
| 2017/0123724 A1 | 5/2017 | Park et al. |
| 2017/0133087 A1 | 5/2017 | Park et al. |

* cited by examiner

FIG. 9A

|  | Read State | Number of Sensing |
|---|---|---|
| Region1,2 | RD1~RD3 | 3 |
| Region3 | RD4~RD8 | 2 |
| Region4 | RD9~RD15 | 3 |

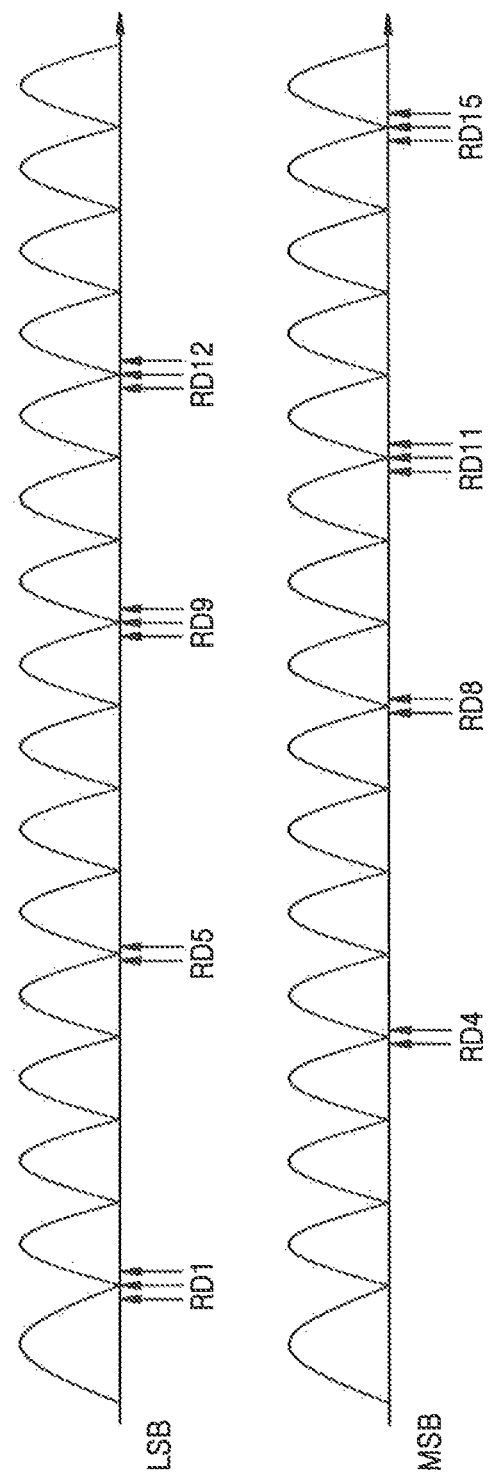

FIG. 10A

|  | Read State | Number of Sensing |
|---|---|---|
| Region1 | RD1 | 4 |
| Region2 | RD2~RD3 | 3 |
| Region3 | RD4~RD8 | 2 |
| Region4 | RD9~RD15 | 3 |

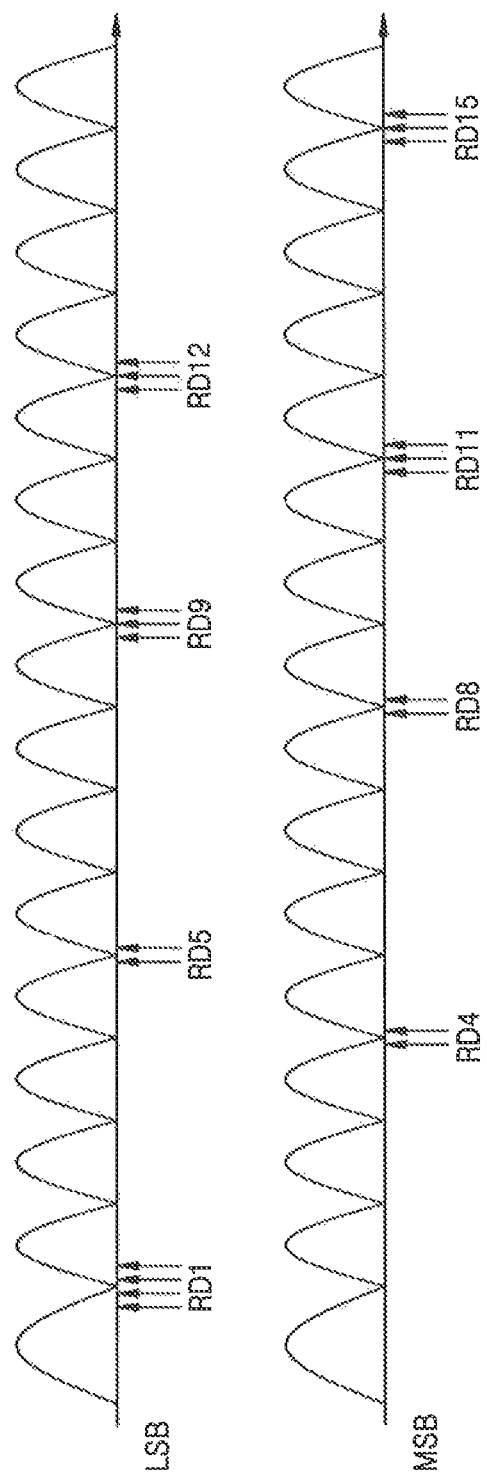

NON-VOLATILE MEMORY DEVICE AND A METHOD OF OPERATING THE SAME

CROSS-REFERENCE TO RELATED APPLICATION

This application claims priority under 35 U.S.C. § 119 to Korean Patent Application No. 10-2018-0003446, filed on Jan. 10, 2018, in the Korean Intellectual Property Office, the disclosure of which is incorporated by reference herein in its entirety.

TECHNICAL FIELD

The inventive concept relates to a memory device, and more particularly, to non-volatile memory devices capable of performing multi-sensing.

DISCUSSION OF RELATED ART

A semiconductor memory device may be implemented by using semiconductors, such as silicon (Si), germanium (Ge), gallium arsenide (GaAs), and indium phosphide (InP). Semiconductor memory devices may be volatile memory devices or non-volatile memory devices. Volatile memory devices retain stored data while powered but when power is interrupted, the data is lost. A non-volatile memory device does not lose stored data when power is interrupted.

Non-volatile memory devices may include read-only memories (ROMs), programmable ROMs (PROMs), erasable PROMs (EPROMs), electrically EPROMs (EEPROMs), flash memory devices, phase-change random-access memories (RAMs) (PRAMs), magneto-resistive RAMs (MRAMs), and ferroelectric RAMs (FRAMs). Flash memory devices may be NOR type or NAND type flash memories.

SUMMARY

According to an exemplary embodiment of the inventive concept, there is provided a non-volatile memory device including a memory cell array comprising a plurality of memory cells; a page buffer for performing a plurality of read operations and storing results of the plurality of read operations, wherein each of the read operations includes at least one sensing operation for selected memory cells from the plurality of memory cells; a multi-sensing manager for determining a number of sensing operations for each of the plurality of read operations and controlling the page buffer to perform the plurality of read operations; and a data identifier for identifying a data state of a bit for the selected memory cells based on the results of the plurality of read operations, wherein the multi-sensing manager determines the number of sensing operations for at least one read operation from among the plurality of read operations to be different from the number of sensing operations for other read operations from among the plurality of read operations.

According to an exemplary embodiment of the inventive concept, there is provided a non-volatile memory device including a memory cell array comprising a plurality of memory cells; a page buffer configured to perform a read operation on selected memory cells from among the plurality of memory cells, wherein the read operation includes a plurality of sensing operations; a multi-sensing manager configured to control the page buffer to perform a first read operation for performing a plurality of first sensing operations based on a first sensing voltage set and a second read operation for performing a plurality of second sensing operations based on a second sensing voltage set; and a data identifier configured to identify a data state of a bit for the selected memory cells based on a result of the first read operation and a result of the second read operation, and to store the results in a latch set, wherein a number of the first sensing operations is different from a number of the second sensing operations.

According to an exemplary embodiment of the inventive concept, there is provided a method of operating a non-volatile memory device including a plurality of memory cells connected to a plurality of bit lines, the method including determining a number of sensing operations for each of a plurality of read operations, wherein each of the read operations performs at least one sensing operation for memory cells selected from among the plurality of memory cells by using a sensing voltage set; sequentially performing the plurality of read operations on memory cells selected from among the plurality of memory cells based on the number of sensing operations; and identifying a data state of a bit for the selected memory cells based on results of the plurality of read operations, wherein the number of sensing operations corresponding to at least one read operation from among the plurality of read operations is different from the number of sensing operations for other read operations from among the plurality of read operations.

According to an exemplary embodiment of the inventive concept, there is provided a non-volatile memory system including a memory controller configured to determine a number of sensing operations corresponding to each of a plurality of read operations; and a non-volatile memory device configured to perform the plurality of read operations and identify a data state of a bit for selected memory cells based on results of the plurality of operations, wherein each of the plurality of read operations performs at least one sensing operation on memory cells selected from among the plurality of memory cells, and wherein the memory controller determines the number of sensing operations corresponding to at least one read operation from among the plurality of read operations to be different from the number of sensing operations corresponding to other read operations from among the plurality of read operations.

BRIEF DESCRIPTION OF THE DRAWINGS

The above and other features of the inventive concept will be more clearly understood by describing in detail exemplary embodiments thereof with reference to the accompanying drawings in which:

FIGS. 9A and 9B are diagrams showing an operation of a non-volatile memory device according to an exemplary embodiment of the inventive concept;

FIGS. 10A and 10B are diagrams showing an operation of a non-volatile memory device according to an exemplary embodiment of the inventive concept;

DETAILED DESCRIPTION OF THE EMBODIMENTS

Figure 1:
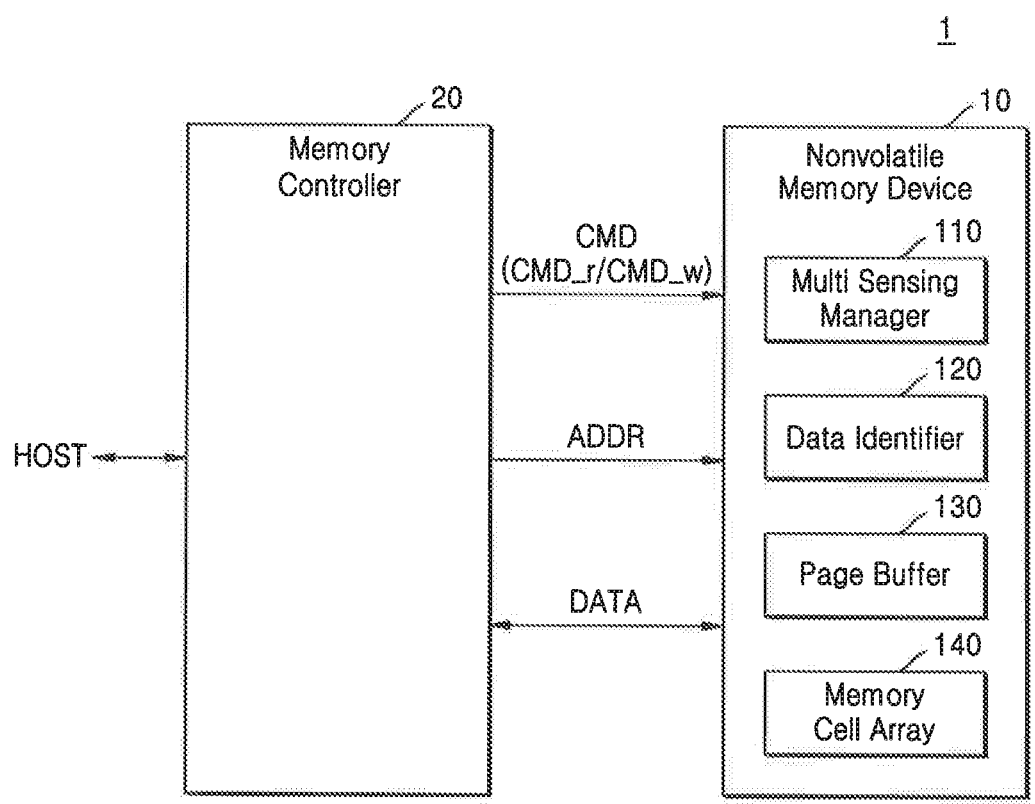
FIG. 1 is a block diagram showing a non-volatile memory system according to an exemplary embodiment of the inventive concept.

FIG. 1 is a block diagram showing a non-volatile memory system 1 according to an exemplary embodiment of the inventive concept.

Referring to FIG. 1, the non-volatile memory system 1 may include a memory controller 20 and a non-volatile memory device 10. According to an exemplary embodiment of the inventive concept, each of a host HOST, the memory controller 20, and the non-volatile memory device 10 may be provided as one chip, one package, one module, etc. Additionally, the memory controller 20 and the non-volatile memory device 10 may be packages including package-on-packages (PoPs), ball grid arrays (BGAs), chip scale packages (CSPs), plastic leaded chip carriers (PLCCs), Plastic Dual In-Line Packages (PDIPs), Die-in-Waffle Packs, Die-in-Wafer Forms, Chip-On-Boards (COBs), Ceramic Dual In-Line Packages (CERDIPs), Plastic Metric Quad Flat Packs (MQFPs), Thin Quad Flatpacks (TQFPs), Small Outline Integrated Circuits (SOICs), Shrink Small Outline Packages (SSOPs), Thin Small Outline Packages (TSOPs), System-In-Packages (SIPs), Multi Chip Packages (MCPs), Wafer-Level Fabricated Packages (WFPs), Wafer-Level Processed Stack Packages (WSPs), and the like.

The memory controller 20 may control the non-volatile memory device 10 in response to a write request or a read request received from the host HOST. For example, the memory controller 20 may transmit a command CMD and an address ADDR to the non-volatile memory device 10 in response to a write request or a read request received from the host HOST. The address ADDR that the memory controller 20 transmits to the non-volatile memory device 10 may be a physical address in the non-volatile memory device 10. The memory controller 20 may exchange data with the non-volatile memory device 10. For example, when the command CMD is a write command CMD_w, the non-volatile memory device 10 may write data DATA received from the memory controller 20 to a memory cell array 140. When the command CMD is a read command CMD_r, the non-volatile memory device 10 may output data DATA stored at an address ADDR received from the memory controller 20 to the memory controller 20.

The non-volatile memory device 10 may include a multi-sensing manager 110, a data identifier 120, a page buffer 130, and the memory cell array 140. The multi-sensing manager 110 may control the page buffer 130 to perform multi-sensing for identifying a certain state of selected memory cells corresponding to the read command CMD_r received from the memory controller 20. Multi-sensing may refer to a plurality of sensing operations performed to identify any one data state stored in selected memory cells. Multi-sensing may be referred to as an on-chip-valley search. A plurality of read operations may be performed to identify any one data state stored in memory cells, and each of the plurality of read operations may include a plurality of sensing operations based on a sensing voltage set. The multi-sensing manager 110 may determine the number of sensing operations for each of the plurality of read operations. Furthermore, the multi-sensing manager 110 may determine a sequence for performing the plurality of read operations.

According to an exemplary embodiment of the inventive concept, the multi-sensing manager 110 may determine the number of sensing operations corresponding to at least one of the plurality of read operations to be different from those corresponding to the remaining read operations. In other words, the number of sensing operations corresponding to a first read operation may be different from the number of sensing operations corresponding to a second read operation. For example, the multi-sensing manager 110 may distinguish a plurality of read operations from one another based on a reference voltage and determine different numbers of sensing operations for the distinguished read operations, respectively. Descriptions thereof will be given below with reference to FIG. 8.

According to an exemplary embodiment of the inventive concept, the multi-sensing manager 110 may determine a sequence for performing a plurality of read operations based on the determined number of sensing operations. For example, the multi-sensing manager 110 may determine a sequence for performing a plurality of read operations, such that a read operation corresponding to the smallest determined number of sensing operations is performed last. Descriptions thereof will be given below with reference to FIG. 15.

The data identifier 120 may perform processing for selecting optimal data from among a plurality of pieces of data stored in the page buffer 130 due to the multi-sensing. For selecting optimal data, the data identifier 120 may include a cell counter and may refer to a count result provided from the cell counter. In other words, the data identifier 120 may control the page buffer 130 to select and output data closest to a valley from among a plurality of pieces of data due to the multi-sensing. Detailed descriptions of the operation of the data identifier 120 will be given below with reference to FIGS. 13A through 14B.

The page buffer 130 may include a write driver and a sense amplifier. During a write operation, the page buffer 130 may transfer a bit line voltage corresponding to data to be written to a bit line of the memory cell array 140. During a read operation or a verify operation, the page buffer 130 may sense data stored in a selected memory cell through a bit line. The page buffer 130 may include a plurality of latch sets connected to one or two bit lines.

The memory cell array 140 may include a plurality of memory cells. For example, the plurality of memory cells may be flash memory cells. Hereinafter, exemplary embodiments of the inventive concept will be described assuming the case that the plurality of memory cells are NAND flash memory cells. However, the inventive concept is not limited thereto and, in other exemplary embodiments, the plurality of memory cells may be resistive memory cells like resistive RAMs (RRAMs), phase change RAMs (PRAMs), or magnetic RAMs (MRAMs).

The memory cell array 140 may be a 3-dimensional (3D) memory cell array. The 3D memory cell array may include an active area arranged on a silicon substrate and circuits associated with the operation of memory cells. The circuits may be monolithically formed on or in the silicon substrate with at least one physical level of the memory cell array. The term "monolithic" may refer to a structure in which circuits are stacked on the layers of lower levels of the memory cell array. The 3D memory cell array includes NAND strings arranged in a vertical direction, such that at least one memory cell is located above another memory cell. The at least one memory cell may include a charge trapping layer. However, the inventive concept is not limited thereto and, in other exemplary embodiments, the memory cell array 140 may be a two-dimensional (2D) memory cell array.

U.S. Pat. Nos. 7,679,133, 8,553,466, 8,654,587, and 8,559,235, and U.S. Patent Application Publication No. 2011/0233648 disclose configurations of a 3D memory array including a plurality of levels in which word lines and/or bit lines are shared among the plurality of levels. The disclosures of these patent documents are incorporated by reference herein in their entireties. Furthermore, U.S. Patent Application Publication No. 2014-0334232 and U.S. Pat. No. 8,488,381 are incorporated by reference herein in their entireties.

According to the present embodiment, each memory cell included in the memory cell array 140 may be a multi-level cell (MLC) storing two or more bits of data. For example, a memory cell may be an MLC storing two bits of data. In another example, a memory cell may be a triple-level cell (TLC) for storing 3-bit data or a quadruple-level cell (QLC) for storing 4-bit data. However, the inventive concept is not limited thereto. For example, some memory cells included in the memory cell array 140 may be single level cells (SLCs) for storing 1-bit data, and the remaining memory cells may be MLCs.

Figure 2:
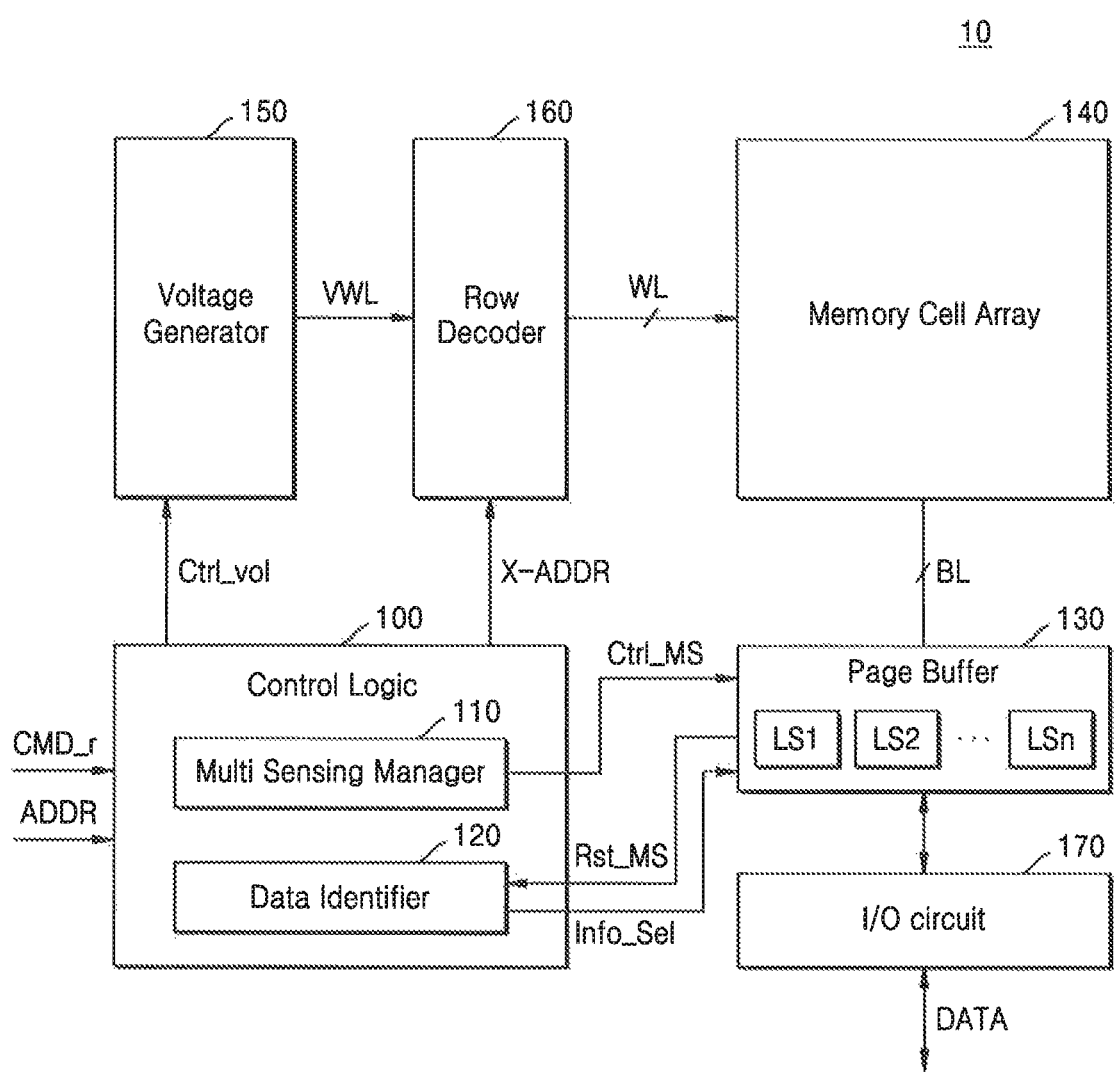
FIG. 2 is a block diagram showing a non-volatile memory device according to an exemplary embodiment of the inventive concept.

FIG. 2 is a block diagram showing a non-volatile memory device according to an exemplary embodiment of the inventive concept. Descriptions identical or similar to those given above with reference to FIG. 1 may be omitted.

Referring to FIG. 2, the non-volatile memory device 10 may include a control logic 100, a page buffer 130, the memory cell array 140, a voltage generator 150, a row decoder 160, and an input/output circuit 170.

The control logic 100 may include the multi-sensing manager 110 and the data identifier 120. The control logic 100 may output various control signals for writing data to the memory cell array 140 or reading data from the memory cell array 140, based on commands CMD_w/CMD_r and an address ADDR received from a memory controller (e.g., 20 of FIG. 1).

The multi-sensing manager 110 may output a multi-sensing control signal Ctrl_MS to the page buffer 130 in response to a read command CMD_r received from the memory controller (e.g., 20 of FIG. 1), and the page buffer 130 may perform multi-sensing on a selected memory cell in response to the multi-sensing control signal Ctrl_MS. According to an exemplary embodiment of the inventive concept, the multi-sensing control signal Ctrl_MS may include information about the number of sensing operations for each of a plurality of read operations. According to an exemplary embodiment of the inventive concept, the multi-sensing control signal Ctrl_MS may include information about a sequence for performing the plurality of read operations.

The page buffer 130 may include a plurality of latch sets LS1 through LSn, and each of the plurality of latch sets LS1 through LSn may perform sensing and latching for performing a multi-sensing operation. For example, the page buffer 130 may perform a sensing operation through a plurality of bit lines BL. In other words, each of the plurality of latch sets LS1 through LSn may perform a plurality of sensing operations to identify states of data stored in selected memory cells under the control of the control logic 100. Next, each of the plurality of latch sets LS1 through LSn may store data sensed through the plurality of sensing operations and select any one of the pieces of data under the control of the control logic 100. Each of the plurality of latch sets LS1 through LSn may perform multi-sensing to identify states of data stored in memory cells. According to an exemplary embodiment of the inventive concept, the plurality of latch sets LS1 through LSn may perform sensing operations a different numbers of times for each of a plurality of read operations based on the multi-sensing control signal Ctrl_MS provided from the multi-sensing manager 110. Each of the plurality of latch sets LS1 through LSn may select or output optimum data from among a plurality of pieces of data sensed under the control of the control logic 100.

The voltage generator 150 may generate various types of voltages for performing write, read, and erase operations with respect to the memory cell array 140 based on a voltage control signal Ctrl_vol. For example, the voltage generator 150 may generate a word line voltage VWL, e.g., a program voltage (or a write voltage), a read voltage, a pass voltage (or an unselected word line voltage), a verify voltage, or a recovery voltage.

The row decoder 160 may select some word lines WL in response to a row address X-ADDR. The row decoder 160 transfers a word line voltage to a word line WL. During a program operation, the row decoder 160 may apply a program voltage and a verify voltage to a selected word line WL and apply a program inhibit voltage to an unselected word line WL. During a read operation, the row decoder 160 may apply a read voltage to a selected word line WL and apply a read inhibit voltage to an unselected word line WL. During a recovery operation, the row decoder 160 may apply a recovery voltage to a selected word line WL. Furthermore, the row decoder 160 may select some string select lines SSLs or some ground select lines GSLs in response to the row address X-ADDR.

The input/output circuit 170 may receive data from an external device (e.g., a memory controller) and store the input data in the memory cell array 140. Furthermore, the input/output circuit 170 may read data from the memory cell array 140 and output the read data to an external device.

Figure 3:
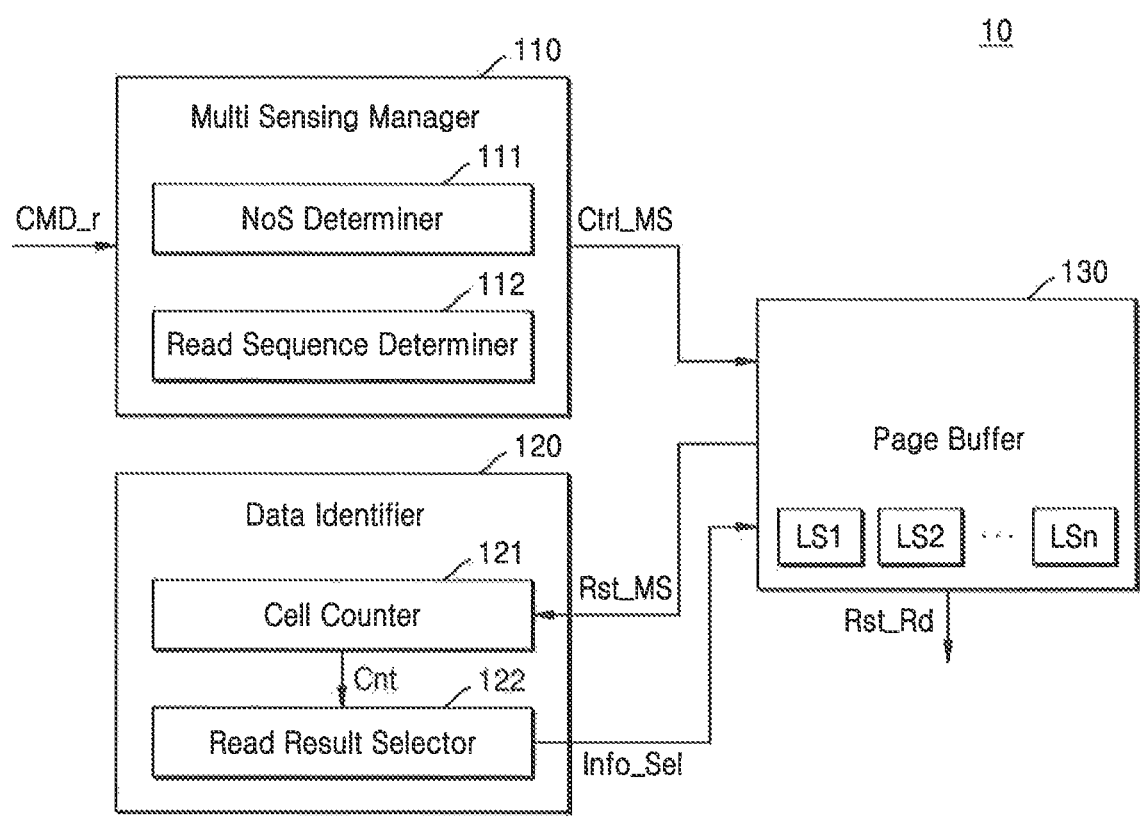
FIG. 3 is a block diagram showing a non-volatile memory device according to an exemplary embodiment of the inventive concept.

FIG. 3 is a block diagram showing a non-volatile memory device according to an exemplary embodiment of the inventive concept. Descriptions identical or similar to those given above with reference to FIGS. 1 and 2 may be omitted.

Referring to FIG. 3, the non-volatile memory device 10 may include the multi-sensing manager 110, the data identifier 120, and the page buffer 130, wherein the multi-sensing manager 110 may include a sensing operation number determiner 111 (e.g., NoS Determiner) and a read operation sequence determiner 112 (e.g., Read Sequence Determiner). The sensing operation number determiner 111 may determine the number of sensing operations for each of a plurality of read operations. Each of the plurality of read operations may include a plurality of sensing operations based on a sensing voltage set. According to an exemplary embodiment of the inventive concept, the sensing operating number determiner 111 may determine the number of sensing operations for each of the plurality of read operations based on the sensing voltage set or voltage levels of read voltages corresponding to the sensing voltage set. For example, the sensing operation number determiner 111 may determine the number of sensing operations by comparing a reference voltage with the sensing voltage set or read voltages corresponding to the sensing voltage set. To accomplish this, the sensing operation number determiner 111 may include a storage device for storing the reference voltage and the number of sensing operations corresponding thereto. According to an exemplary embodiment of the inventive concept, the memory controller 20 may update the reference voltage and the number of sensing operations corresponding thereto through the read command CMD_r.

For example, the sensing operation number determiner 111 may determine a first number of times as the number of sensing operations when the voltage level of the sensing voltage set is equal to or less than a first reference voltage. The sensing operation number determiner 111 may determine a second number of times as the number of sensing operations when the voltage level of the sensing voltage set is greater than the first reference voltage and is equal to or less than a second reference voltage. The sensing operation number determiner 111 may determine a third number of times as the number of sensing operations when the voltage level of the sensing voltage set is greater than the second reference voltage. Furthermore, the sensing operation number determiner 111 may determine the first number of times and the third number of times to be greater than the second number of times.

In another example, the sensing operation number determiner 111 may determine a first number of times as the number of sensing operations when the voltage level of the sensing voltage set is equal to or less than a first reference voltage. The sensing operation number determiner 111 may determine a second number of times as the number of sensing operations when the voltage level of the sensing voltage set is greater than the first reference voltage and is equal to or less than a second reference voltage. The sensing operation number determiner 111 may determine a third number of times as the number of sensing operations when the voltage level of the sensing voltage set is greater than the second reference voltage and is equal to or less than a third reference voltage. The sensing operation number determiner 111 may determine a fourth number of times as the number of sensing operations when the voltage level of the sensing voltage set is greater than the third reference voltage. Furthermore, the sensing operation number determiner 111 may determine the first number of times to be greater than the second number of times and the third number of times and determine the fourth number of times to be greater than the third number of times.

During a multi-sensing operation, the page buffer 130 may latch a sensing node at different development time points. For example, the sensing voltage set may refer to voltage levels at different time points at which the sensing node is latched.

The read operation sequence determiner 112 may determine a sequence for performing a plurality of read operations. According to an exemplary embodiment of the inventive concept, the read operation sequence determiner 112 may determine a sequence for performing a plurality of read operations based on the number of sensing operations. For example, the read operation sequence determiner 112 may determine a sequence for performing a plurality of read operations as follows: perform a first read operation corresponding to the smallest number of sensing operations from among the plurality of read operations last and sequentially perform the plurality of read operations other than the first read operation in ascending order or descending order according to the voltage levels of a corresponding sensing voltage set. In other words, a plurality of read operations other than a first read operation are sequentially performed, and then, the first read operation is performed.

The multi-sensing manager 110 may transmit a multi-sensing control signal Ctrl_MS including information about a determined sensing operation number and information about a sequence of performing read operations to the page buffer 130. The page buffer 130 is controlled to perform multi-sensing in response to the multi-sensing control signal Ctrl_MS.

The page buffer 130 may perform multi-sensing and store results of the multi-sensing in first through Nth latch sets LS1 through LSn. In an example in which the number of sensing operations determined by the multi-sensing manager 110 is four (4), each of the first through Nth latch sets LS1 through LSn may include a first latch for storing data sensed through a first sensing operation, a second latch for storing data sensed through a second sensing operation, a third latch for storing data sensed through a third sensing operation, and a fourth latch for storing data sensed through a fourth sensing operation. The page buffer 130 may transmit a plurality of pieces of data obtained through mull-sensing to the data identifier 120 as a multi-sensing result Rst_MS. When the number of sensing operations determined by the multi-sensing manager 110 is greater than four (4), each of the first through Nth latch sets LS1 through LSn may include mode than four latches.

The data identifier 120 may include a cell counter 121 and a read result selector 122. The cell counter 121 may perform cell counting based on the multi-sensing result Rst_MS and output a count result Cnt to the read result selector 122. The read result selector 122 may select optimum data from among a plurality of pieces of data included in the multi-sensing result Rst_MS as read data, based on the count result Cnt.

For example, when the number of sensing operations determined is two (2), the read result selector 122 compares the number of ON cells counted by using a first latch with the number of OFF cells counted by using a second latch. This way, the read result selector 122 determines read data indicating a data state regarding a selected memory cell from among data stored in the first latch and the second latch. Detailed descriptions thereof will be given below with reference to FIGS. 13A through 13C.

For example, when the number of sensing operations determined is three (3), the read result selector 122 calculates a first cell count by comparing a result counted by the first latch with a result counted by the second latch, calculates a second cell count by comparing a result counted by the second latch with a result counted by the third latch, and compares the first cell count with the second cell count. This way, the read result selector 122 determines read data indicating a data state regarding a selected memory cell from among data included in the first through third latches. Detailed descriptions thereof will be given below with reference to FIGS. 14A and 14B.

For example, when the number of sensing operations determined is four (4), the read result selector 122 compares results counted by the first through fourth latches with one another, thereby determining read data indicating a data state regarding a selected memory cell from among data included in the first through fourth latches.

The data identifier 120 may output information Info_Sel about determined read data to the page buffer 130, and the page buffer 130 may output data corresponding to the information Info_Sel to the input/output circuit 170 as a read result Rst_Rd.

Figure 4:
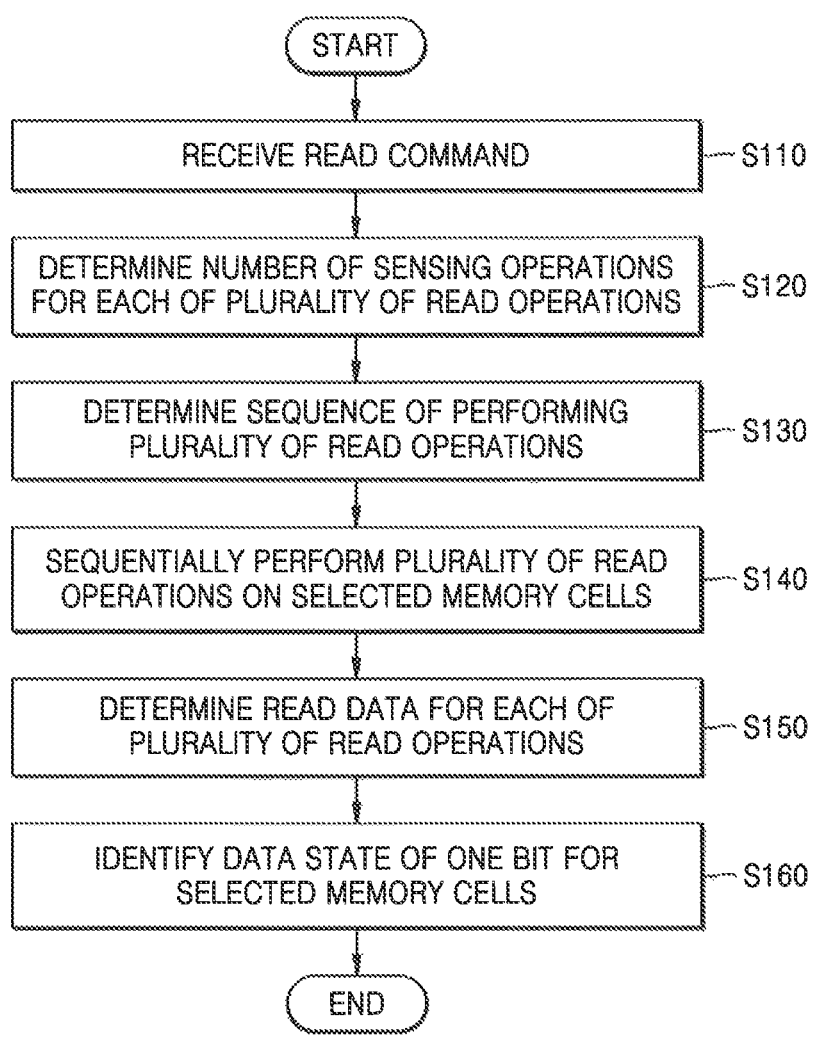
FIG. 4 is a flowchart of an operation of a non-volatile memory system according to an exemplary embodiment of the inventive concept.

FIG. 4 is a flowchart of operation of a non-volatile, memory system according to an exemplary embodiment of the inventive concept.

Referring to FIGS. 2 and 4, when the non-volatile memory device 10 receives the read command CMD_r (operation S110), the multi-sensing manager 110 may determine the number of sensing operations for each of a plurality of read operations (operation S120). The multi-sensing manager 110 may determine a sequence of performing a plurality of read operations based on the determined number of sensing operations (operation S130). The multi-sensing manager 110 may control the page buffer 130 to sequentially perform a plurality of read operations for selected memory cells based on the determined number of sensing operations and the sequence of performing the plurality of read operations (operation S140). The data identifier 120 may receive a multi-sensing result Rst_MS from the page buffer 130 and determine read data for each of the plurality of read operations based on the multi-sensing result Rst_MS (operation S150). The non-volatile memory device 10 may identify a data state of one bit for selected memory cells based on the read data of the plurality of read operations (operation S160).

Figure 5:
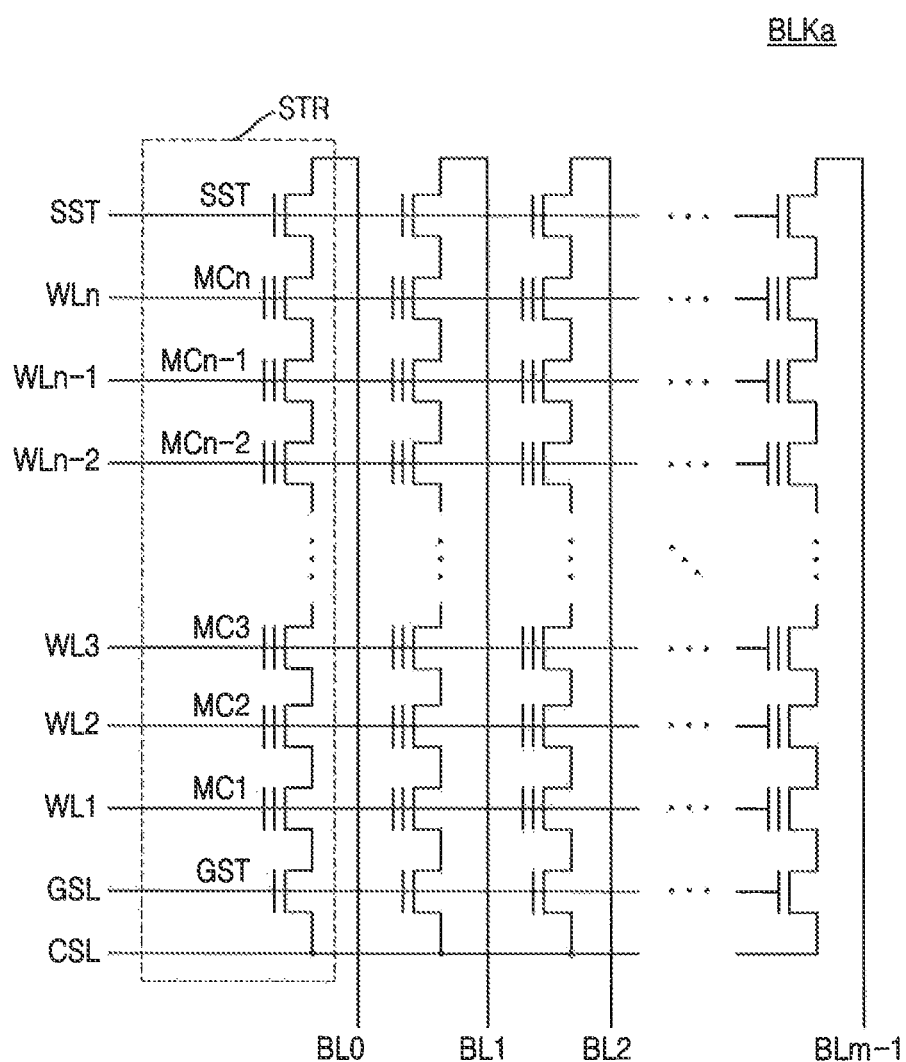
FIG. 5 is a circuit diagram showing a memory block included in a memory cell array according to an exemplary embodiment of the inventive concept.

FIG. 5 is a circuit diagram showing a memory block included in a memory cell array according to an exemplary embodiment of the inventive concept.

Referring to FIG. 5, a memory cell array (e.g., the memory cell array 140 in FIG. 2) may be a memory cell array of a horizontal NAND flash memory and may include a plurality of memory blocks. Each memory block BLKa may include n (n is an integer equal to or greater than 2) cell strings STR in which a plurality of memory cells MC (e.g., MC1-MCn) are connected in series across bit lines BL0 through BLm-1. For example, FIG. 5 shows an example in which each cell string STR includes eight or more memory cells MC.

In a NAND flash memory device having the structure as shown in FIG. 5, an erase operation is performed block-by-block and a program operation is performed page-by-page, where pages correspond to word lines WL0 through WL7 when each cell string STR includes eight memory cells MC. FIG. 5 shows an example in which n pages respectively corresponding to n word lines WL1 through WLn are arranged per block. Furthermore, the non-volatile memory device 10 of FIGS. 1 and 2 may include a plurality of memory cell arrays that have the same structure and perform the same operation as the memory cell array 140 described above.

Figure 6:
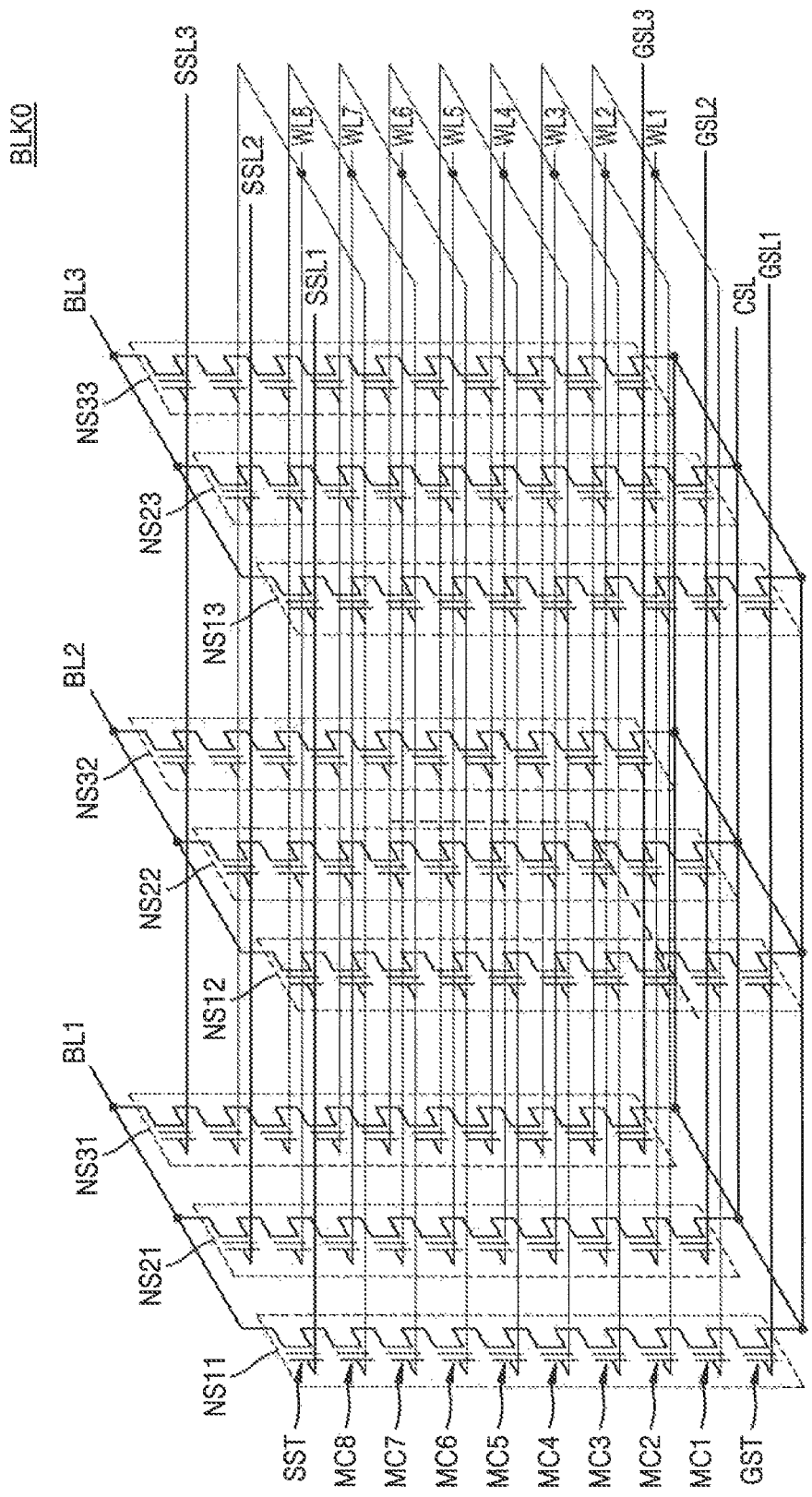
FIG. 6 is a circuit diagram showing a memory block included in a memory cell array according to an exemplary embodiment of the inventive concept.

FIG. 6 is a circuit diagram showing a memory block included in a memory cell array according to an exemplary embodiment of the inventive concept.

Referring to FIG. 6, a memory cell array (e.g., the memory cell array 140 in FIG. 2) may be a memory cell array of a vertical NAND flash memory and may include a plurality of memory blocks. Each memory block BLK0 may include a plurality of NAND cell strings NS11 through NS33, a plurality of word lines WL1 through WL8, a plurality of bit lines BL1 through BL3, a plurality of ground select lines GSL1 through GSL3, a plurality of cell string select lines SSL1 through SSL3, and a common source line CSL. Here, the number of NAND cell strings, the number of word lines, the number of bit lines, the number of ground select lines, and the number of cell string select lines may vary according to exemplary embodiments of the inventive concept.

NAND cell strings NS11, NS21, and NS31 are provided between a first bit line BL1 and the common source line CSL, NAND cell strings NS12, NS22, and NS32 are provided between a second bit line BL2 and the common source line CSL, and NAND cell strings NS13, NS23, and NS33 are provided between a third bit line BL3 and the common source line CSL. Each NAND cell string (e.g., the NAND cell string NS11) may include a cell string select transistor SST, a plurality of memory cells MC1 through MC8, and a ground select transistor GST that are connected in series.

NAND cell strings connected in common to one bit line BL constitute one column. For example, the NAND cell strings NS12, NS21, and NS31 connected in common to the first bit line BL1 may correspond to a first column, the NAND cell strings NS12, NS22, and NS32 connected in common to the second bit line BL2 may correspond to a second column, and the NAND cell strings NS13, NS23, and NS33 connected in common to the third bit line BL3 may correspond to a third column.

NAND cell strings connected to one cell string select line SSL constitute one row. For example, NAND cell strings NS21, NS12, and NS13 connected to a first cell string select line SSL1 correspond to a first row, NAND cell strings NS21, NS22, and NS23 connected to a second cell string select line SSL2 correspond to a second row, and NAND cell strings NS31, NS32, and NS33 connected to a third cell string select line SSL3 correspond to a third row.

Cell string select transistors SST are connected to corresponding cell string select lines SSL1 through SSL3. The plurality of memory cells MC1 through MC8 are connected to corresponding word lines WL1 through WL8. The ground select transistors GST are connected to corresponding ground select lines GSL1 through GSL3. The cell string select transistors SST are connected to their corresponding bit lines BL1 through BL3, and the ground select transistors GST are connected to the common source line CSL.

The word lines (e.g., first word lines WL1) at a same height are connected to one another in common, the cell string select lines SSL1 through SSL3 are separated from one another, and the ground select lines GSL1 through GSL3 are also separated from one another. For example, in the case of programming memory cells MC1 connected to the first word lines WL1 and belonging to the NAND cell strings NS11, NS12, and NS13, the first word lines WL1 and the first cell string select line SSL1 are selected. The ground select lines GSL1 through GSL3 may also be connected to one another in common.

Figure 7:
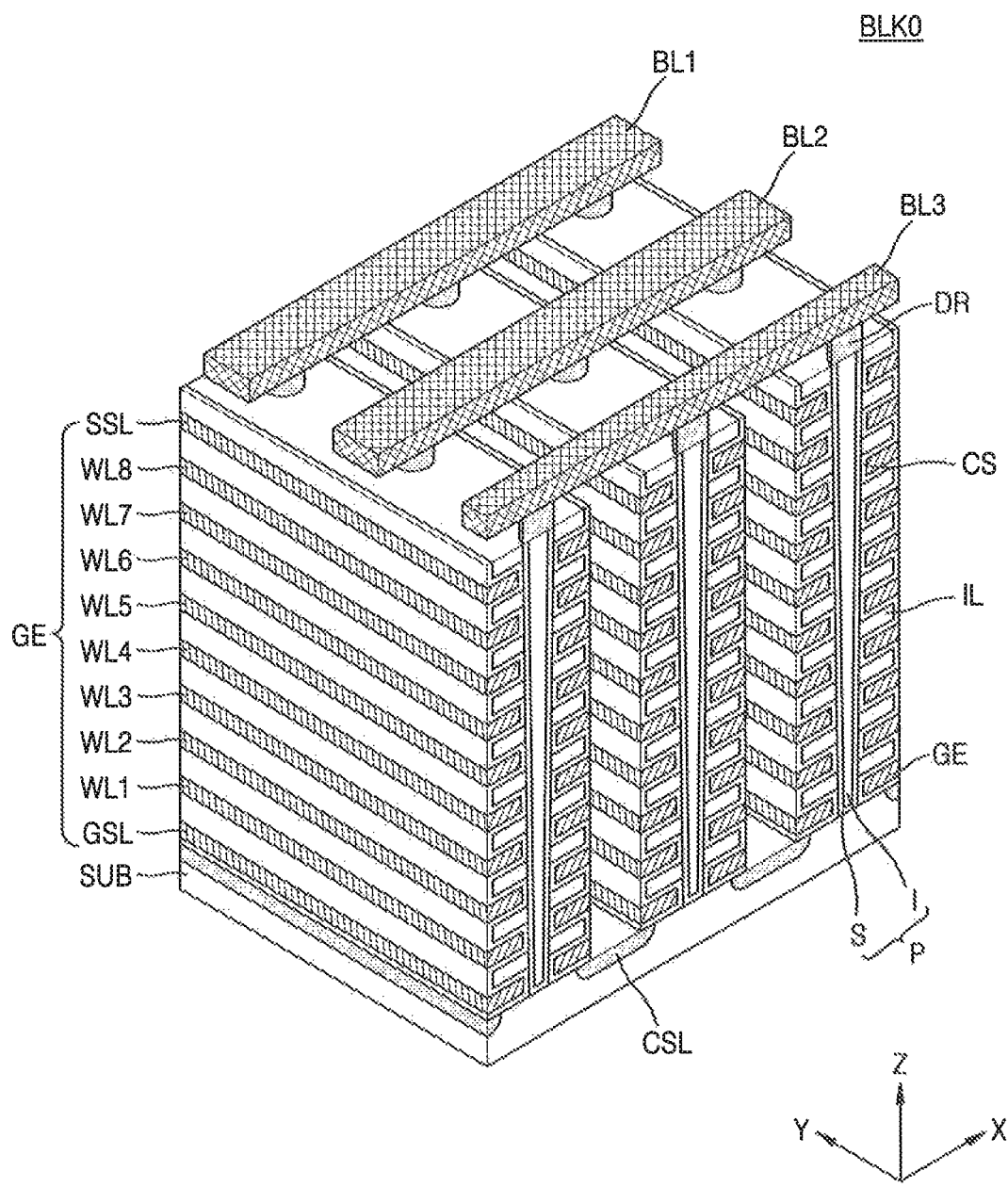
FIG. 7 is a perspective view of a memory block of FIG. 6, according to an exemplary embodiment of the inventive concept.

FIG. 7 is a perspective view of the memory block BLK0 of FIG. 6, according to an exemplary embodiment of the inventive concept.

Referring to FIG. 7, each memory block included in a memory cell array (e.g., the memory cell array 140 in FIG. 2) is formed in a direction perpendicular to a substrate SUB. Although FIG. 6 shows that each memory block includes two select lines GSL and SSL, eight word lines WL1 through WL8, and three bit lines BL1 through BL3, the numbers of the respective elements may be greater or less than the above-stated numbers.

The substrate SUB has a first conductivity type (e.g., p type), wherein the common source line CSL, which extends in a first direction (e.g., the Y direction) and is doped with impurities having a second conductivity type (e.g., n type), is provided on the substrate SUB. A plurality of insulation films IL extending in the first direction are sequentially provided in a third direction (e.g., the Z direction) in a region of the substrate SUB between two common source lines CSL adjacent to each other. The plurality of insulation films IL are a particular distance apart from one another in the third direction. For example, the plurality of insulation films IL may include an insulation material, such as a silicon oxide.

A plurality of pillars P are provided on the substrate SUB. For example, the plurality of pillars P are sequentially arranged in the first direction in a region of the substrate SUB between two adjacent common source lines CSL and penetrate through the plurality of insulation films IL in the first direction. For example, the plurality of pillars P may penetrate through the plurality of insulation films IL and contact the substrate SUB. A surface layer S of each pillar P may include a silicon-based material having a first conductivity type and function as a channel region. An inner layer 1 of the each pillar P may include an insulating material like a silicon oxide or an air gap.

In a region between two adjacent common source lines CSL, a charge storage layer CS is provided along exposed surfaces of the insulation films IL, the plurality of pillars P, and the substrate SUB. The charge storage layer CS may include a gate insulation layer (e.g., a 'tunnelling insulation layer'), a charge trapping layer, and a blocking insulation layer. For example, the charge storage layer CS may have an oxide-nitride-oxide (ONO) structure. Furthermore, in the region between two adjacent common source lines CSL, gate electrodes GE including the select lines GSL and SSL and the word lines WL1 through WL8 are provided on an exposed surface of the charge storage layer CS.

Drains or drain contacts DR are provided on the plurality of pillars P, respectively. For example, the drains or drain contacts DR may include a silicon-based material doped with impurities having a second conductivity type. Bit lines BL1 through BL3, which extend in a second direction (e.g., X direction) and are arranged a certain distance apart from one another in the first direction, are provided on the drains DR.

Figure 8:
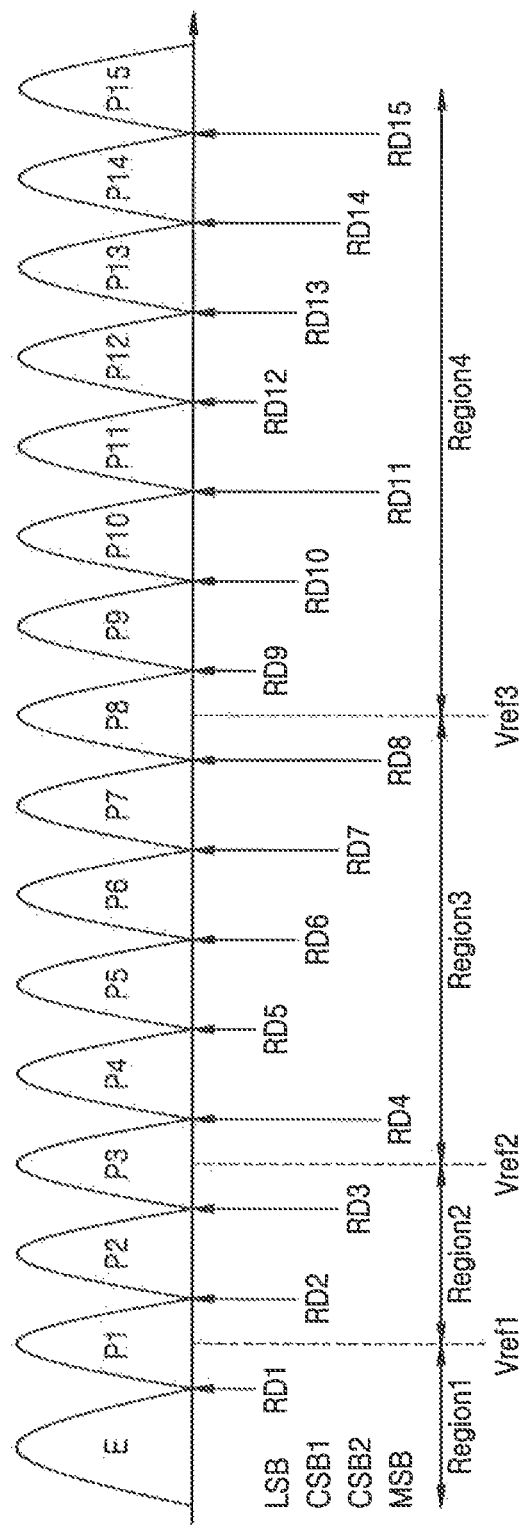
FIG. 8 is a graph showing cell spread according to an exemplary embodiment of the inventive concept.

FIG. 8 is a graph showing cell spread according to an exemplary embodiment of the inventive concept. FIG. 8 may show a method of reading a QLC, which is capable of storing 4 bits of data per cell, page-by-page. Furthermore, the horizontal axis of the graph of FIG. 8 represents threshold voltage levels of a cell, whereas the vertical axis of the graph represents the numbers of cells.

Referring to FIGS. 2 and 8, to read a least significant bit (LSB) page, a first read operation RD1, a fifth read operation RD5, a ninth read operation RD9, and a twelfth read operation RD12 may be performed according to a sequence of performing read operations determined by the multi-sensing manager 110. For example, the multi-sensing manager 110 may read the LSB page in the order of the first read operation RD1, the ninth read operation RD9, the twelfth read operation RD12, and the fifth read operation RD5, and the first read operation RD1 may be first provided to word lines of selected memory cells. An ON/OFF state of the first read operation RD1 may be sensed and stored in any one of a plurality of latches. A logic '1' may be latched as a result of sensing a memory cell (e.g., an ON cell) having a lower threshold voltage than the first read operation RD1, and a logic '0' may be latched as a result of sensing a memory cell (e.g., an OFF cell) having a threshold voltage equal to or higher than the first read operation RD1. Thereafter, the fifth read operation RD5, the ninth read operation RD9, and the twelfth read operation RD12 may be sequentially provided to the word lines of the selected memory cells. For each of the fifth read operation RD5, the ninth read operation RD9, and the twelfth read operation RD12, a previously latched logic value is maintained for a memory cell sensed as an ON cell, whereas a previously latched logic value may be toggled for a memory cell sensed as an OFF cell. After such processing is completed, a result of reading the LSB page may be output.

To read a first intermediate bit (CSB1) page, a second read operation RD2, a sixth read operation RD6, a tenth read operation RD10, and a thirteenth read operation RD13 may be performed according to a sequence of performing read operations determined by the multi-sensing manager 110. To read a second intermediate bit (CSB2) page, a third read operation RD3, a seventh read operation RD7, and a fourteenth read operation RD14 may be performed according to a sequence of performing read operations determined by the multi-sensing manager 110. Furthermore, to read a most significant bit (MSB) page, a fourth read operation RD4, an eighth read operation RD8, an eleventh read operation RD11, and a fifteenth read operation RD15 may performed according to a sequence of performing read operations determined by the multi-sensing manager 110.

Furthermore, each of the first through fifteenth read operations RD1 through RD15 may be performed based on a sensing voltage set including a plurality of read voltages having different voltage levels. In this case, the multi-sensing manager 110 may apply sensing voltage sets respectively corresponding to the first through fifteenth read operations RD1 through RD15 to selected memory cells based on the number of sensing operations that are different from one another. For example, a threshold voltage level may include a first region Region1 that is less than or equal to a first reference voltage Vref1, a second region Region2 that is greater than the first reference voltage Vref1 and less than or equal to a second reference voltage Vref2, a third region Region3 that is greater than the second reference voltage Vref2 and less than or equal to a third reference voltage Vref3, and a fourth region Region4 that is greater than the third reference voltage Vref3. The multi-sensing manager 110 may determine the different numbers of sensing operations for each of the regions Region1-Region4. As the memory cell array 140 is degraded, degrees of degradation in respective regions may differ according to programmed threshold voltages. According to an exemplary embodiment of the inventive concept, according to degrees of degradation of particular regions, the multi-sensing manager 110 determines the number of times to perform multi-sensing to be relatively large in a severely degraded region and determines the number of times to perform multi-sensing to be relatively small in a region not severely degraded, and thus, read operations may be efficiently performed.

Although FIG. 8 shows a case related to a QLC, the inventive concept is not limited thereto. For example, an exemplary embodiment of the inventive concept may also be applied to an SLC, an MLC, and a TLC.

FIGS. 9A and 9B are diagrams showing an operation of a non-volatile memory device according to an exemplary embodiment of the inventive concept. For example, FIGS. 9A and 9B show an embodiment in which the multi-sensing manager 110 divides threshold voltage levels into three regions and determines different numbers of sensing operations for the respective regions.

Referring to FIGS. 2, 8, and 9A, the multi-sensing manager 110 may determine the number of sensing operations for first through third read operations RD1 through RD3 corresponding to the first region Region1 and the second region Region2 as '3', determine the number of sensing operations for fourth through eighth read operations RD4 through RD8 corresponding to the third region Region3 as '2', and determine the number of sensing operations for ninth through fifteenth read operations RD9 through RD15 corresponding to the fourth region Region4 as '3'.

FIG. 9B is a cell spread graph showing a plurality of read operations for a LSB page and a plurality of read operations for a MSB page that are performed according to the numbers of sensing operations determined according to the embodiment of FIG. 9A. For the LSB page, the multi-sensing manager 110 may control the page buffer 130, such that three (3) sensing operations are performed for the first read operation RD1 included in the first region Region1, two (2) sensing operations are performed for the fifth read operation RD5 included in the third region Region3, and three (3) sensing operations are performed for each of the ninth read operation RD9 and the twelfth read operation RD12 included in the fourth region Region4.

For the MSB page, the multi-sensing manager 110 may control the page buffer 130, such that two (2) sensing operations are performed for each of the fourth read operation RD4 and the eighth read operation RD8 included in the third region Region3 and three (3) sensing operations are performed for each of the eleventh read operation RD11 and the fifteenth read operation RD15 included in the fourth region Region4.

FIGS. 10A and 10B are diagrams showing an operation of a non-volatile memory device according to an exemplary embodiment of the inventive concept. For example, FIGS. 10A and 10B show an embodiment in which the multi-sensing manager 110 divides threshold voltage levels into four regions and determines different numbers of sensing operations for the respective regions.

Referring to FIGS. 2, 8, and 10A, the multi-sensing manager 110 may determine the number of sensing operations for a first read operation RD1 corresponding to the first region Region1 as '4', determine the number of sensing operations for second and third read operations RD2 and RD3 corresponding to the third region Region2 as '3', determine the number of sensing operations for fourth through eighth read operations RD4 through RD8 corresponding to the third region Region3 as '2', and determine the number of sensing operations for ninth through fifteenth read operations RD9 through RD15 corresponding to the fourth region Region4 as '3'.

FIG. 10B is a cell spread graph showing a plurality of read operations for a LSB page and a plurality of read operations for a MSB page that are performed according to the numbers of sensing operations determined according to the embodiment of FIG. 10A. For the LSB page, the multi-sensing manager 110 may control the page buffer 130, such that four (4) sensing operations are performed for the first read operation RD1 included in the first region Region1, two (2) sensing operations are performed for the fifth read operation RD5 included in the third region Region3, and three (3) sensing operations are performed for each of the ninth read operation RD9 and the twelfth read operation RD12 included in the fourth region Region4.

For the MSB page, the multi-sensing manager 110 may control the page buffer 130, such that two (2) sensing operations are performed for each of the fourth read operation RD4 and the eighth read operation RD5 included in the third region Region3 and three (3) sensing operations are performed for each of the eleventh read operation RD11 and the fifteenth read operation RD15 included in the fourth region Region4.

Figure 11:
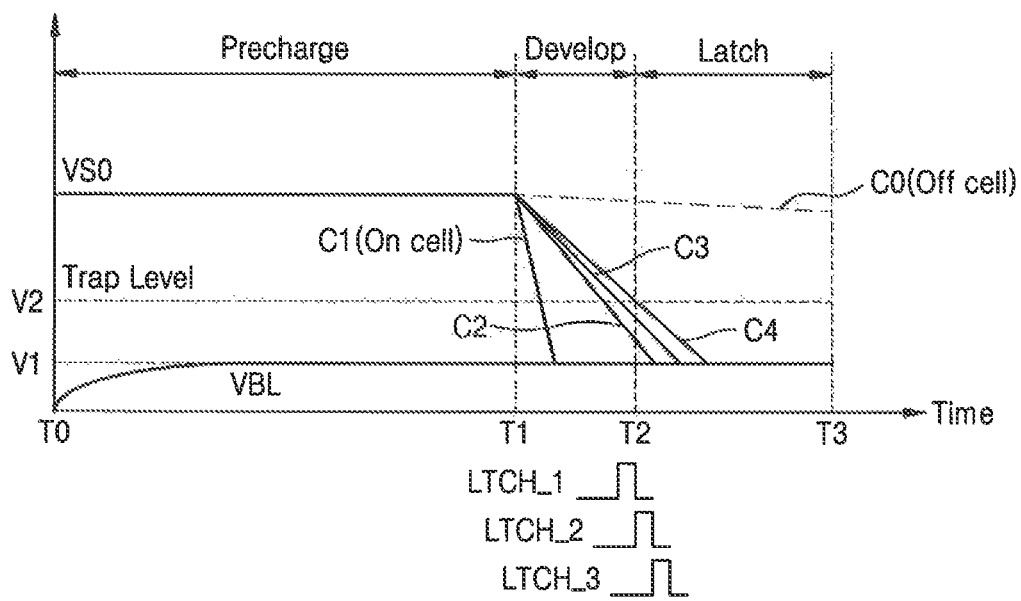
FIG. 11 is a waveform diagram showing changes of the level of a sensing node according to an exemplary embodiment of the inventive concept.

FIG. 11 is a waveform diagram showing changes of the level of a sensing node according to an exemplary embodiment of the inventive concept.

Referring to FIG. 11, changes of the level of a sensing node according to a threshold voltage level of a memory cell and latched results according to development time points may be shown. The period from a time point T0 to a time point T1 will be referred to as a precharge period, the period from the time point T1 to a time point T2 will be referred to as a development period, and the period after the time point T2 will be referred to as a latch period.

In the precharge period, a bit line voltage VBL may be charged to a first voltage level V1, and the sensing node may be charged to a sensing node voltage VSO. At the time point T1 at which the development period starts, charges charged in the sensing node may move to a bit line. When there is a strong OFF cell having a threshold voltage relatively higher than a read voltage, a change of the level of the sensing node may be relatively small. A change of the potential of a sensing node of a strong OFF cell in the development period is indicated by a dotted line C0. For example, the potential of the sensing node of the strong OFF cell barely drops in the development period.

When there is a strong ON cell having a threshold voltage relatively lower than a read voltage, a change of the level of the sensing node may be relatively large. A change of the potential of a sensing node of a strong ON cell in the development period is indicated by a first curved line C1. For example, the potential of the sensing node of the strong ON cell drops to the first voltage level V1 in the development period. Strong OFF cells or strong ON cells may not be significantly affected by small changes in development time. Changes of the potential of a sensing node for sensing memory cells of which threshold voltages are located around a read voltage are indicated by second through fourth curves C2, C3, and C4, respectively. A second curve C2 may show a development tendency of a memory cell having a threshold voltage slightly lower than a read voltage, a third curve C3 may show a development tendency of a memory cell having a threshold voltage almost similar to the read voltage, and a fourth curve C4 may show a development tendency of a memory cell having a threshold voltage slightly higher than the read voltage.

According to a multi-sensing operation, a first latch signal LTCH_1 for latching a sensing node of memory cells may be provided. The first latch signal LTCH_1 may move a latch time point to an earlier time point based on the time point T2. When a sensing node is latched by the first latch signal LTCH_1, latches for a strong OFF cell C0 and a strong ON cell C1 may be set to logic values corresponding to an OFF cell and an ON cell, respectively. However, the memory cells with a relatively low threshold voltage corresponding to the second curve C2 may be latched to a logic value corresponding to an ON cell. Additionally, memory cells corresponding to the third and fourth curves C3 and C4 may be latched by the first latch signal LTCH_1 to a logic value corresponding to an OFF cell.

When a sensing node is latched by a second latch signal LTCH_2, a logic '0' and a logic '1' may be latched for a strong OFF cell CO and a strong ON cell C1 as in the case with the first latch signal LTCH_1. However, memory cells having the threshold voltage corresponding to the second curve C2 may be latched to the logic value corresponding to an ON cell. Additionally, in case of memory cells corresponding to the third curve C3, a trap level V2 in which the logic '0' and the logic '1' are not clearly distinguished, may be latched by the second latch signal LTCH_2. Memory cells corresponding to the fourth curve C4 may be latched by the second latch signal LTCH_2 to a logic value corresponding to an OFF cell.

When a sensing node is latched by a third latch signal LTCH_3, a logic '0' and a logic '1' may be latched for a strong OFF cell CO and a strong ON cell C1 as in the case with the first latch signal LTCH_1. However, all memory cells having the threshold voltages corresponding to the second and third curves C2 and C3 may be latched to the logic value '1' corresponding to an ON cell. Furthermore, memory cells corresponding to the fourth curve C4 may be latched to the logic value '0' corresponding to an OFF cell by the third latch signal LTCH_3.

By latching the state of a sensing node to a logic value at different development time points to identify any one state as in the above-described method, read voltages may be provided at different levels to a word line according to development time points. The sensing voltage set may refer to a plurality of different voltage levels of a sensing node according to latching time points according to the method described above or a plurality of voltage levels at different levels provided to the word line for sensing.

Figure 12:
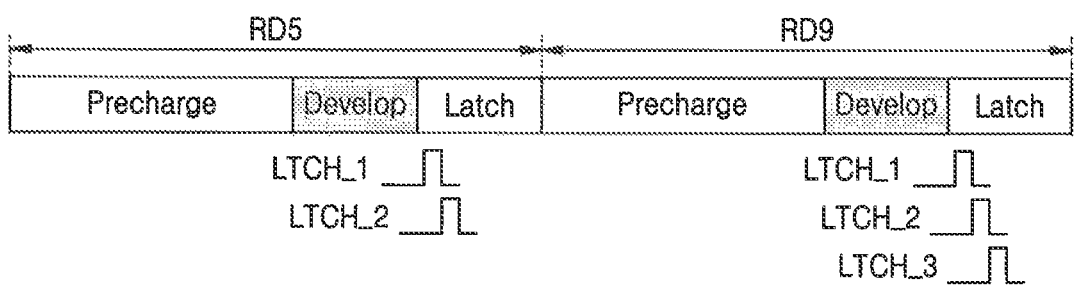
FIG. 12 is a timing diagram showing a read operation according to an exemplary embodiment of the inventive concept.

FIG. 12 is a timing diagram showing a read operation according to an exemplary embodiment of the inventive concept. Descriptions identical or similar to those given above with reference to FIG. 11 may be omitted.

Referring to FIGS. 2 and 12, the fifth read operation RD5 and the ninth read operation RD9 may be performed to multi-sense the MSB page. In the embodiment of FIG. 12, the multi-sensing manager 110 may determine that the number of sensing operations corresponding to the fifth read operation RD5 is '2' and the number of sensing operations corresponding to the ninth read operation RD9 is '3'. In the fifth read operation RD5, a bit line and a sensing node are precharged, and a read voltage corresponding to the fifth read operation RD5 may be provided to word lines of selected memory cells. When the precharging of the bit line and the sensing node is completed, a development operation in which the potential of the sensing node is changed according to states of a memory cell may occur in the page buffer 130. Furthermore, states of the selected memory cells may be latched by sequentially providing latch signals LTCH_1 and LTCH_2 at different development time points. After latching the selected memory cells, latched data may be stored in the page buffer 130 in a plurality of latches provided in the plurality of latch sets LS1 through LSn.

Next, in the ninth read operation RD9, a bit line and a sensing node are precharged, and a read voltage corresponding to the ninth read operation RD9 may be provided to word lines of selected memory cells. When the precharging of the bit line and the sensing node is completed, a development operation in which the potential of the sensing node is changed according to states of a memory cell may occur in the page buffer 130. Furthermore, states of the selected memory cells may be latched by sequentially providing latch signals LTCH_1, LTCH_2, and LTCH_3 at different development time points. After latching the selected memory cells, latched data may be stored in the page buffer 130 in a plurality of latches provided in the plurality of latch sets LS1 through LSn.

The data identifier 120 may perform an operation for comparing and selecting data latched in respective latches included in the plurality of latch sets LS1 through LSn. For example, cells may be counted by comparing data latched by the first latch signal LTCH_1 with data latched by the second latch signal LTCH_2. Next, the number of memory cells may be counted by comparing data latched by the second latch signal LTCH_2 with data latched by the third latch signal LTCH_3. The numbers of the counted cells may be compared with one another, thereby selecting any one of the data sets respectively latched by the latch signals LTCH_1, LTCH_2, and LTCH_3.

Figure 13A:
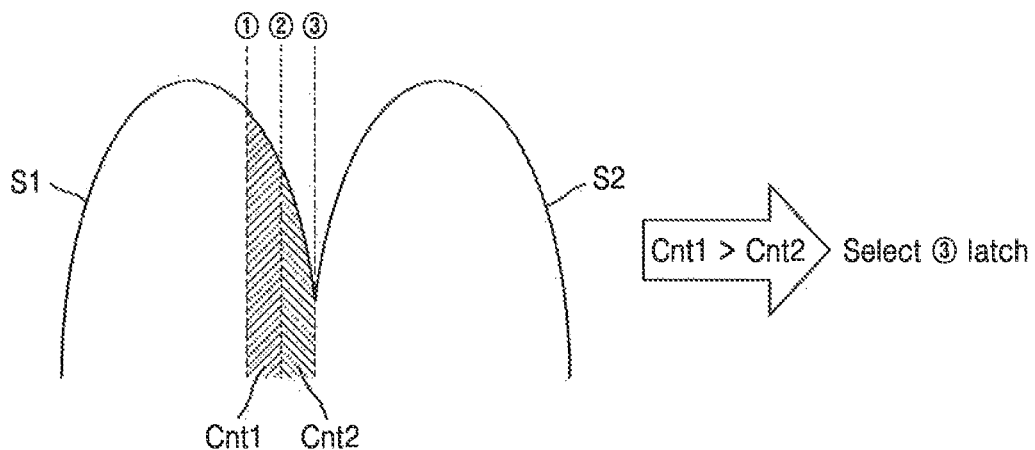
FIGS. 13A, 13B and 13C are diagrams showing a method of selecting data when the number of sensing operations is '3' according to an exemplary embodiment of the inventive concept.
Figure 13B:
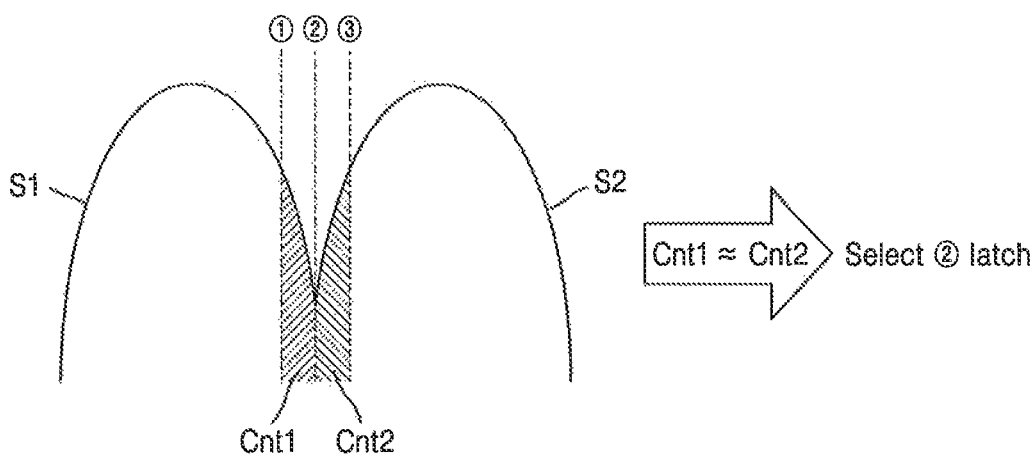
Figure 13C:
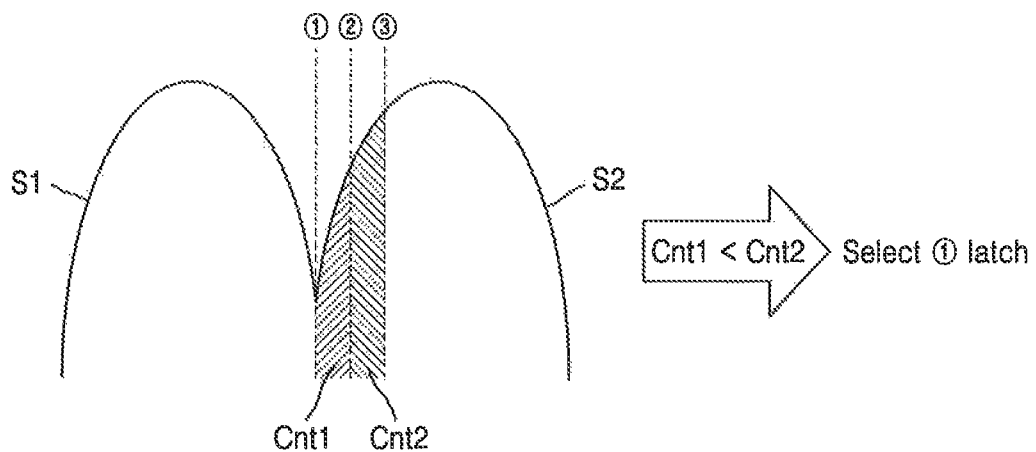

FIGS. 13A through 13C are diagrams showing a method of selecting data when the number of sensing operations is '3' according to an exemplary embodiment of the inventive concept. For example, FIG. 13A shows a method of selecting data in the case where threshold voltages of memory cells sensed through multi-sensing are located on the left side of a valley. The valley in FIG. 13A may correspond to an area indicated by (3). FIG. 13B shows a method of selecting data in the case where threshold voltages of memory cells sensed through multi-sensing are located around a valley. The valley in FIG. 13B may correspond to an area indicated by (2). FIG. 13C shows a method of selecting data in the case where threshold voltages of memory cells sensed through multi-sensing are located on the right side of a valley. The valley in FIG. 13C may correspond to an area indicated by (1).

Referring to FIGS. 13A and 13B, the threshold voltage levels of memory cells stored in latch sets may be indicated according to multi-sensing for identifying two states S1 and S2 of memory cells. In other words, FIGS. 13A and 13B each provide a spread diagram showing positions of threshold voltages of memory cells when they are sensed at different development time points or when they are sensed by sensing voltages of different levels.

Under a same read voltage condition, a sensed and latched result may be matched with a sensing voltage at a level (1) when the state of a sensing node is latched to a logic level by the first latch signal LTCH_1, a sensed and latched result may be matched with a sensing voltage at a level (2) when the state of a sensing node is latched to a logic level by the second latch signal LTCH_2, and a sensed and latched result may be matched with a sensing voltage at a level (3) when the state of a sensing node is latched to a logic level by the third latch signal LTCH_3.

Memory cells of which threshold voltages are located between the level (1) and the level (2) may be counted by comparing a first latch corresponding to the level (1) and a second latch corresponding to the level (2). For example, the data identifier 120 may perform an exclusive logical or (XOR) operation on data latched in each of the first latch and the second latch, thereby counting the number Cnt1 of first memory cells of which threshold voltage is located between the level (1) and the level (2). The data identifier 120 may perform an XOR operation on data latched in each of the second latch and the third latch to count the number Cnt2 of second memory cells of which threshold voltage is located between the level (2) and the level (3).

When the numbers Cnt1 and Cnt2 of memory cells are counted, the data identifier 120 may compare the counted numbers of the memory cells. In the embodiment of FIG. 13A, when it is determined that the number Cnt1 of the first memory cells is greater than the number Cnt2 of the second memory cells, the data identifier 120 may select a third latch set corresponding to the level (3) and determine data stored in the third latch set as optimum data. In the embodiment of FIG. 13B, when it is determined that the number Cnt1 of the first memory cells is equal to the number Cnt2 of the second memory cells or a difference therebetween is less than or equal to a reference value, the data identifier 120 may select a second latch set corresponding to the level (2) and determine data stored in the second latch set as optimum data. In the embodiment of FIG. 13C, when it is determined that the number Cnt1 of the first memory cells is smaller than the number Cnt2 of the second memory cells, the data identifier 120 may select a first latch set corresponding to the level (1) and determine data stored in the first latch set as optimum data.

Figure 14A:
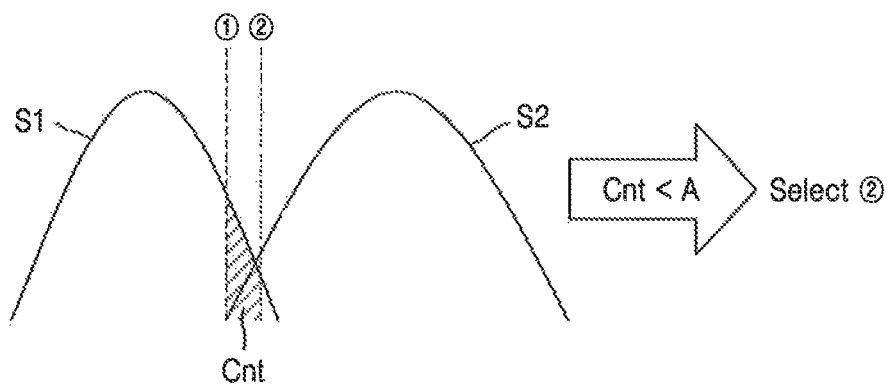
FIGS. 14A and 14B are diagrams showing a method of selecting data when the number of sensing operations is '2' according to an exemplary embodiment of the inventive concept.
Figure 14B:
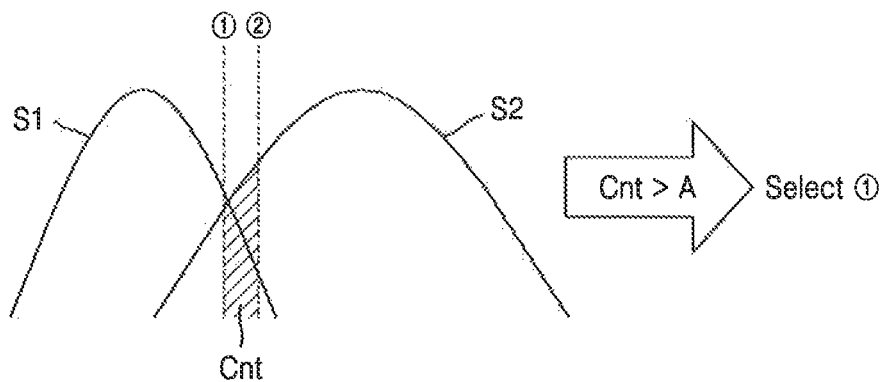

FIGS. 14A and 14B are diagrams showing a method of selecting data when the number of sensing operations is '2' according to an exemplary embodiment of the inventive concept. For example, FIG. 14A shows a method of selecting data in the case where threshold voltages of memory cells sensed through multi-sensing are located on the left side of a valley, and FIG. 14B shows a method of selecting data in the case where threshold voltages of memory cells sensed through multi-sensing are located on the right side of a valley. In FIGS. 14A and 14B, the threshold voltage levels of memory cells stored in latch sets may be indicated according to multi-sensing for identifying two states S1 and S2 of the memory cells.

Under a same read voltage condition, a sensed and latched result may be matched with a sensing voltage at a level (1) when the state of a sensing node is latched to a logic level by the first latch signal LTCH_1, and a sensed and latched result may be matched with a sensing voltage at a level (2) when the state of a sensing node is latched to a logic level by the second latch signal LTCH_2.

From among memory cells, first memory cells having a threshold voltage higher than the level (1) may be counted by using the first latch, and second memory cells having a threshold voltage lower than the level (2) may be counted by using the second latch. The data identifier 120 may generate a count Cnt through an XOR operation on the first memory cells and the second memory cells.

The data identifier 120 may compare the count Cnt with a reference bit (or value) A. In the embodiment of FIG. 14A, when it is determined that the count Cnt is smaller than the reference bit A, the data identifier 120 may select the second latch corresponding to the level (2) and determine the data stored in the second latch as optimum data. In the embodiment of FIG. 14B, when it is determined that the count Cnt is greater than the reference bit A, the data identifier 120 may select the first latch corresponding to the level (1) and determine the data stored in the first latch as optimum data.

Figure 15:
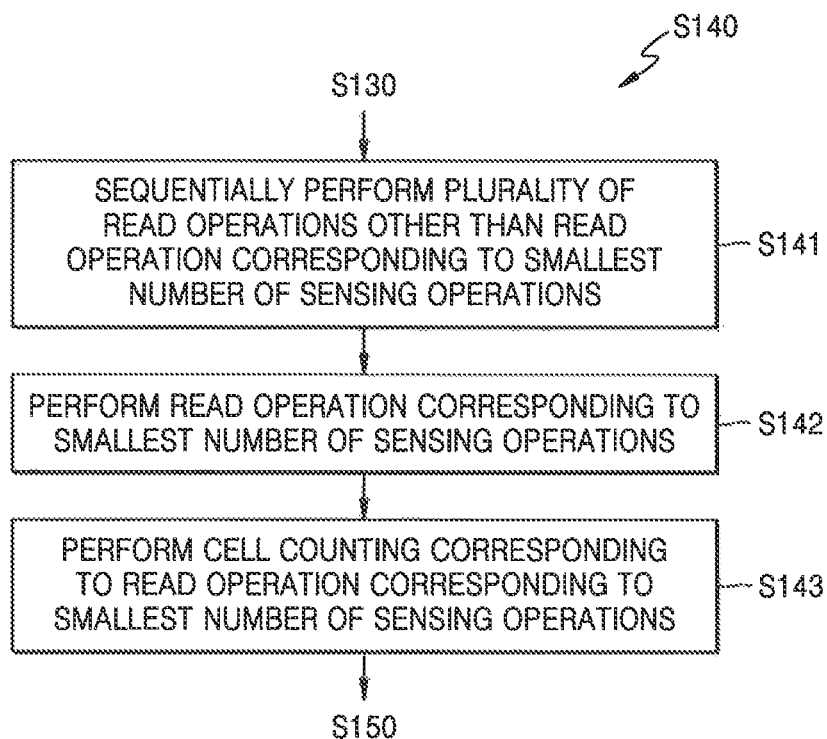
FIG. 15 is a flowchart of an operation of a non-volatile memory system according to an exemplary embodiment of the inventive concept.

FIG. 15 is a flowchart of an operation of a non-volatile memory system according to an exemplary embodiment of the inventive concept. For example, FIG. 15 is a flowchart showing the operation S140 of FIG. 4 for sequentially performing a plurality of read operations.

Referring to FIGS. 2 and 15, the non-volatile memory device 10 may sequentially perform the plurality of read operations other than the read operation corresponding to the smallest number of sensing operations (operation S141). For example, the non-volatile memory device 10 may sequentially perform the plurality of read operations other than the read operation corresponding to the smallest number of sensing operations in ascending order or descending order according to the levels of read voltages. Cell counting for already performed read operations may be performed concurrently by the data identifier 120 while the other read operations are being performed. After the read operations other than the read operation corresponding to the smallest number of sensing operations are completed, the non-volatile memory device 10 may perform the read operation corresponding to the smallest number of sensing operations (operation S142). At this time, cell counting for the read operations other than the read operation corresponding to the smallest number of sensing operations may be completed. After the read operation corresponding to the smallest number of sensing operations is completed, the non-volatile memory device 10 may perform cell counting for the read operation corresponding to the smallest number of sensing operations (operation S143).

Since the cell counting performed last corresponds to the read operation corresponding to the smallest number of sensing operations, a time taken for the last cell counting may also be the shortest. According to an exemplary embodiment of the inventive concept, a cell counting for the read operation corresponding to the smallest number of sensing operations is performed last, and thus, the overall read time may be reduced.

Figure 16:
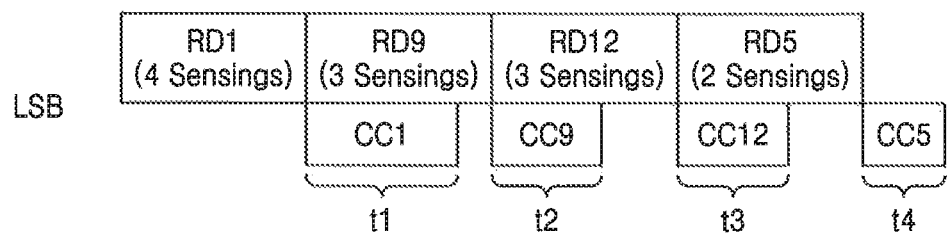
FIG. 16 is a diagram showing a non-volatile memory system according to an exemplary embodiment of the inventive concept.

FIG. 16 is a diagram showing a non-volatile memory system according to an exemplary embodiment of the inventive concept. Descriptions identical or similar to those given above with reference to FIG. 15 may be omitted.

Referring to FIGS. 2 and 16, the multi-sensing manager 110 may control the page buffer 130 to performs a fifth read operation RD5 having a smallest number of sensing operations from among a plurality of read operations RD1, RD5, RD9, and RD12 for an LSB page last. A first cell counting CC1 corresponding to the first read operation RD1 (of 4 sensings) may be performed by the data identifier 120 while the ninth read operation RD9 is being performed by the page buffer 130. A ninth cell counting CC9 corresponding to the read operation RD9 (of 3 sensings) may be performed by the data identifier 120 while the twelfth read operation RD12 is being performed by the page buffer 130. A twelfth cell counting CC12 corresponding to the read operation RD12 (of 3 sensings) may be performed by the data identifier 120 while the fifth read operation RD5 is being performed by the page buffer 130. Therefore, the first cell counting CC1, the ninth cell counting CC9, and the twelfth cell counting CC12 may not affect the overall read time. Furthermore, an elapsed time t4 of a fifth cell counting CC5 may be shorter than elapsed times t1, t2, and t3 of the first cell counting CC1, the ninth cell counting CC9, and the twelfth cell counting CC12, respectively, because the fifth read operation RD5 corresponds to the smallest number of sensing operations. Therefore, according to an exemplary embodiment of the inventive concept, a read operation corresponding to a smallest number of sensing operations is performed last to complete the last cell counting affecting the read time, as quickly as possible, thereby reducing the overall read time. It is to be further understood that the elapsed times t2 and t3 may be shorter than the elapsed time t1.

Although FIG. 16 shows a read operation for the LSB page only, the description thereof may also be applied to a first intermediate bit CSB1, a second intermediate bit CSB2, and the MSB.

Figure 17:
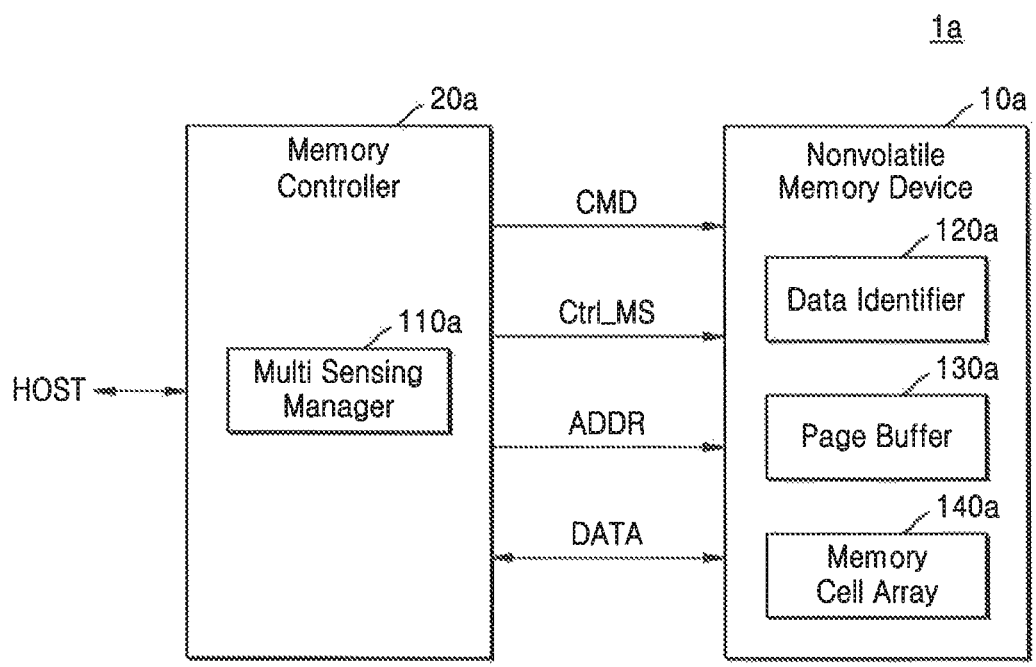
FIG. 17 is a block diagram showing a non-volatile memory device according to an exemplary embodiment of the inventive concept.

FIG. 17 is a block diagram showing a non-volatile memory device according to an exemplary embodiment of the inventive concept. Descriptions identical or similar to those given above with reference to FIG. 1 may be omitted.

Referring to FIG. 17, a non-volatile memory system 1a may include a memory controller 20a and a non-volatile memory device 10a. The memory controller 20a may include a multi-sensing manager 110a, and the non-volatile memory device 10a may include a data identifier 120a, a page buffer 130a, and a memory cell array 140a. Operations of the multi-sensing manager 110a, the data identifier 120a, the page buffer 130a, and the memory cell array 140a may be similar to or same as those of the multi-sensing manager 110, the data identifier 120, the page buffer 130, and the memory cell array 140 of FIG. 1. Therefore, descriptions identical or similar to those given above may be omitted. The multi-sensing manager 110a may be included in the memory controller 20a. The multi-sensing manager 110a may generate a multi-sensing control signal Ctrl_MS based on a read request from a host HOST and output the multi-sensing control signal Ctrl_MS to the non-volatile memory device 10a. The non-volatile memory device 10a may perform multi-sensing on the memory cell array 140a based on the multi-sensing control signal Ctrl_MS.

Figure 18:
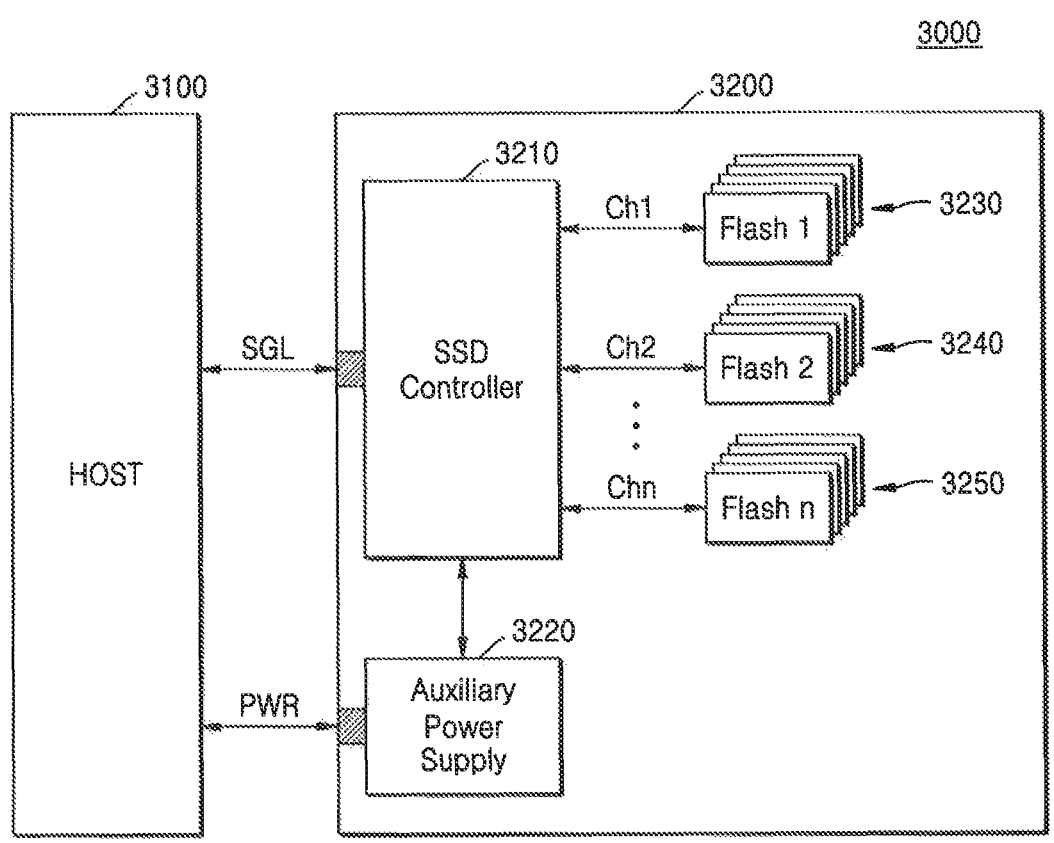
FIG. 18 is a block diagram showing the application of a non-volatile memory device according to an exemplary embodiment of the inventive concept to a solid-state drive (SSD) system.

FIG. 18 is a block diagram showing the application of a non-volatile memory device according to an exemplary embodiment of the inventive concept to a solid-state drive (SSD) system.

Referring to FIG. 18, an SSD system 3000 may include a host 3100 and an SSD 3200. The SSD 3200 exchanges signals SGL with the host 3100 through a signal connector and receives power PWR via a power connector. The SSD 3200 may include an SSD controller 3210, an auxiliary power supply 3220, and a plurality of flash memory devices 3230, 3240, and 3250. The plurality of flash memory devices 3230, 3240 and 3250 may communicate with the SSD controller 3210 via a plurality of channels Ch1 to Chn. Here, the SSD 3200 may be implemented by using the embodiments shown in FIGS. 1 through 17.

For example, the non-volatile memory device 10 of FIG. 2 may be applied to at least one of the flash memory devices 3230, 3240, and 3250. Therefore, when performing read operations, the number of sensing operations for at least one of the flash memory devices 3230, 3240, and 3250 may be determined differently, and a sequence of performing the read operations may be determined based on the determined number of sensing operations. As a result, the efficiency of the read operations may be increased.

A non-volatile memory device according to exemplary embodiments of the inventive concept may be mounted or applied not only to the SSD 3200, but also to a memory card system, a computing system, a universal flash storage (UFS), and the like. Furthermore, a method of operating the non-volatile memory device according to exemplary embodiments of the inventive concept may be applied to various types of electronic systems on which non-volatile memories are mounted.

While the inventive concept has been particularly shown and described with reference to exemplary embodiments thereof; it will be understood by one of ordinary skill in the art that various changes in form and details may be made therein without departing from the spirit and scope of the inventive concept as defined by the following claims.

What is claimed is:

1. A non-volatile memory device, comprising:
    a memory cell array comprising a plurality of memory cells;
    a page buffer for performing a plurality of read operations and storing results of the plurality of read operations, wherein each of the plurality of read operations includes at least one sensing operation for selected memory cells from the plurality of memory cells; and
    a control logic configured to:
        determine a number of sensing operations for each of the plurality of read operations and control the page buffer to perform the plurality of read operations; and
        identify a data state of a bit for the selected memory cells based on the results of the plurality of read operations,
    wherein the control logic determines the number of sensing operations for at least one read operation from among the plurality of read operations to be different from the number of sensing operations for other read operations from among the plurality of read operations,
    wherein the page buffer performs the sensing operations by using a read voltage, and the control logic determines the number of the sensing operations based on a range of voltage levels corresponding to a voltage level of the read voltage among a plurality of ranges of voltage levels.

2. The non-volatile memory device of claim 1, wherein the control logic determines the number of the sensing operations to be a first number when the voltage level of the read voltage is equal to or less that a first reference voltage,
    the control logic determines the number of the sensing operations to be a second number when the voltage level of the read voltage is greater than the first reference voltage and is equal to or less than a second reference voltage, and
    the control logic determines the number of the sensing operations to be a third number when the voltage level of the read voltage is greater than the second reference voltage.

3. The non-volatile memory device of claim 2, wherein the first number and the third number are greater than the second number.

4. The non-volatile memory device of claim 1, wherein the control logic determines the number of the sensing operations to be a first number when the voltage level of the read voltage is equal to or less than a first reference voltage,
    the control logic determines the number of the sensing operations to be a second number when the voltage level of the read voltage is greater than the first reference voltage and is equal to or less than a second reference voltage,
    the control logic further determines the number of the sensing operations to be a third number when the voltage level of the read voltage is equal to or less than a third reference voltage, and
    the control logic determines the number of the sensing operations to be a fourth number when the voltage level of the read voltage is greater than the third reference voltage.

5. The non-volatile memory device of claim 4, wherein the first number is greater than the second number and the third number, and
    the fourth number is greater than the third number.

6. The non-volatile memory device of claim 1, wherein the control logic determines a sequence for performing the plurality of read operations based on the number of sensing operations.

7. The non-volatile memory device of claim 6, wherein the control logic controls the page buffer to perform a first read operation from among the plurality of read operations last, wherein the first read operation has a smallest number of the sensing operations.

8. The non-volatile memory device of claim 7, wherein the control logic controls the page buffer to sequentially perform the plurality of read operations other than the first read operation in an ascending order or a descending order according to voltage levels of their corresponding read voltages.

9. The non-volatile memory device of claim 7, wherein the control logic performs a first cell counting corresponding to the first read operation after the page buffer completes the first read operation, and
the first cell counting is shorter in time than each of a plurality of cell countings respectively corresponding to the plurality of read operations other than the first read operation.

10. The non-volatile memory device of claim 1, wherein the page buffer comprises a latch set for storing the results of the plurality of read operations, and
the page buffer performs the sensing operation at least once at each of different development time points and stores results of the sensing operations in a plurality of latches included in the latch set.

11. The non-volatile memory device of claim 10, wherein the latch set comprises:
a first latch configured to store data sensed through a first sensing operation among the sensing operations;
a second latch configured to store data sensed through a second sensing operation among the sensing operations;
a third latch configured to store data sensed through a third sensing operation among the sensing operations; and
a fourth latch configured to store data sensed through a fourth sensing operation among the sensing operations.

12. The non-volatile memory device of claim 11, wherein the control logic controls the page buffer to store data sensed in the first, second, third and fourth latches by performing at least one of the first, second, third and fourth sensing operations according to the number of the sensing operations for each of the plurality of read operations.

13. The non-volatile memory device of claim 11, wherein, when the number of sensing operations is two, the control logic compares a count generated by an XOR calculation of a number of OFF cells counted by using the first latch to a number of ON cells counted by using the second latch with a reference bit and determines a data state of one of the selected memory cells from the data included in the first latch and the second latch.

14. The non-volatile memory device of claim 11, wherein, when the number of sensing operations is three, the control logic calculates a first cell count by comparing the first latch with the second latch, calculates a second cell count by comparing the second latch with the third latch, and compares the first cell count with the second cell count, thereby determining a data state of one of the selected memory cells from the data included in the first latch, the second latch and, the third latch.

15. The non-volatile memory device of claim 11, wherein, when the number of sensing operations is four, the control logic determines a data state of one of the selected memory cells from the data included in the first latch, the second latch, the third latch and the fourth latch by comparing the first, second, third and fourth latches with one another.

16. A non-volatile memory device, comprising:
a memory cell array comprising a plurality of memory cells;
a page buffer configured to perform a read operation on selected memory cells from among the plurality of memory cells, wherein the read operation includes a plurality of sensing operations; and
a control logic configured to:
control the page buffer to perform a first read operation for performing a plurality of first sensing operations based on a first sensing voltage set and a second read operation for performing a plurality of second sensing operations based on a second sensing voltage set; and
identify a data state of a bit for the selected memory cells based on a result of the first read operation and a result of the second read operation, and to store the results in a latch set,
wherein a number of the first sensing operations is different from a number of the second sensing operations,
wherein the control logic determines a sequence for performing the first and second read operations based on the number of sensing operations, and
wherein the control Ionic controls the pane buffer to perform the first read operation last, wherein the first read operation has a smallest number of the sensing operations.

17. The non-volatile memory device of claim 16, wherein the control logic determines the number of the first sensing operations based on whether the first sensing voltage set has a higher voltage level than a first reference voltage, and
the control logic determines the number of the second sensing operations based on whether the second sensing voltage set has a higher voltage level than the first reference voltage.

18. A non-volatile memory system, comprising:
a memory controller configured to determine a number of sensing operations corresponding to each of a plurality of read operations; and
a non-volatile memory device configured to perform the plurality of read operations and identify a data state of a bit for selected memory cells based on results of the plurality of read operations,
wherein each of the plurality of read operations performs at least one sensing operation on memory cells selected from among a plurality of memory cells, and
wherein the memory controller determines the number of sensing operations corresponding to at least one read operation from among the plurality of read operations to be different from the number of sensing operations corresponding to other read operations from among the plurality of read operations, the non-volatile memory system further comprising:
a page buffer that comprises, a latch set for storing the results of the plurality of read operations, wherein the page buffer performs the sensing operation at least twice at each of different development time points and stores results of the sensing operations in a plurality of latches included in the latch set.

19. The non-volatile memory system of claim 18, wherein a read operation corresponding to a smallest number of the sensing operations is performed last by the non-volatile memory device.

* * * * *